United States Patent
Shibata

(10) Patent No.: US 7,295,468 B2
(45) Date of Patent: Nov. 13, 2007

(54) NONVOLATILE SEMICONDUCTOR MEMORY DEVICE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/401,016

(22) Filed: Apr. 5, 2006

(65) Prior Publication Data

US 2006/0181923 A1    Aug. 17, 2006

Related U.S. Application Data

(63) Continuation of application No. PCT/JP2004/003785, filed on Mar. 19, 2004.

(30) Foreign Application Priority Data

Nov. 13, 2003    (JP)    ............... 2003-383925

(51) Int. Cl.
    *G11C 11/34* (2006.01)
(52) U.S. Cl. .................... 365/185.03; 365/185.18; 365/185.22; 365/185.24; 365/185.17
(58) Field of Classification Search ........... 365/185.03, 365/185.18, 185.22, 185.24, 185.17
See application file for complete search history.

(56) References Cited

U.S. PATENT DOCUMENTS

| | | | | |
|---|---|---|---|---|
| 5,615,165 A | * | 3/1997 | Tanaka et al. | ......... 365/230.06 |
| 5,835,414 A | | 11/1998 | Lee et al. | |
| 5,903,495 A | * | 5/1999 | Takeuchi et al. | ....... 365/185.03 |
| 6,046,935 A | * | 4/2000 | Takeuchi et al. | ........ 365/185.03 |
| 6,178,115 B1 | * | 1/2001 | Shibata et al. | ......... 365/185.03 |
| 6,288,935 B1 | | 9/2001 | Shibata et al. | |
| 6,426,892 B2 | * | 7/2002 | Shibata et al. | ......... 365/185.03 |
| 6,487,122 B2 | * | 11/2002 | Shibata et al. | ......... 365/185.22 |
| 6,657,891 B1 | * | 12/2003 | Shibata et al. | ......... 365/185.03 |
| 6,876,578 B2 | * | 4/2005 | Shibata et al. | ......... 365/185.03 |
| 6,925,004 B2 | * | 8/2005 | Shibata et al. | ......... 365/185.03 |
| 6,944,055 B2 | * | 9/2005 | Shibata et al. | ......... 365/185.03 |
| 7,245,528 B2 | * | 7/2007 | Shibata et al. | ......... 365/185.03 |
| 2003/0137872 A1 | | 7/2003 | Shibata et al. | |
| 2004/0170056 A1 | | 9/2004 | Shibata et al. | |

FOREIGN PATENT DOCUMENTS

JP    2000-195280    7/2000
KR    1999-0072588    9/1999

OTHER PUBLICATIONS

U.S. Appl. No. 11/325,917.
U.S. Appl. No. 11/325,917, filed Jan. 4, 2006, Shibata et al.

* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A page mode multi-level NAND-type memory employs two different verify levels per data state and comprises a first data storage circuit which is connected to a memory cell and which stores externally inputted data of a first logic level or a second logic level, a second data storage circuit which is connected to the memory cell and which stores the data of the first logic level or second logic level read from the memory cell, and a control circuit which controls the memory cell and the first and second data storage circuits and which reproduces the externally inputted data and writing the data into the memory cell.

8 Claims, 21 Drawing Sheets

| 0 | 0→1 | | Data in memory cell | |
|---|---|---|---|---|
| inhibit<br>PDC DDC TDC | Write (OK)<br>PDC DDC TDC | Write (NG)<br>PDC DDC TDC | | |
| H  H<br>H  H | L  L<br>L  L | | Program (write→L, inhibit→H in PDC)<br>DDC→TDC, PDC→DDC, TDC→PDC | Program |
| H  H  H<br>H  H  L<br>H  H  H<br>H  H  H | L  L  H<br>L  L  H<br>L  L  H<br>H  L  H | L  L  H<br>L  L  L<br>L  L  L<br>L  L  L | Bit line precharging<br>Verify read with a*'<br>When DDC is H, TDC=H<br>PDC→DDC, TDC→PDC | 0→1<br>Verify 1, First time |

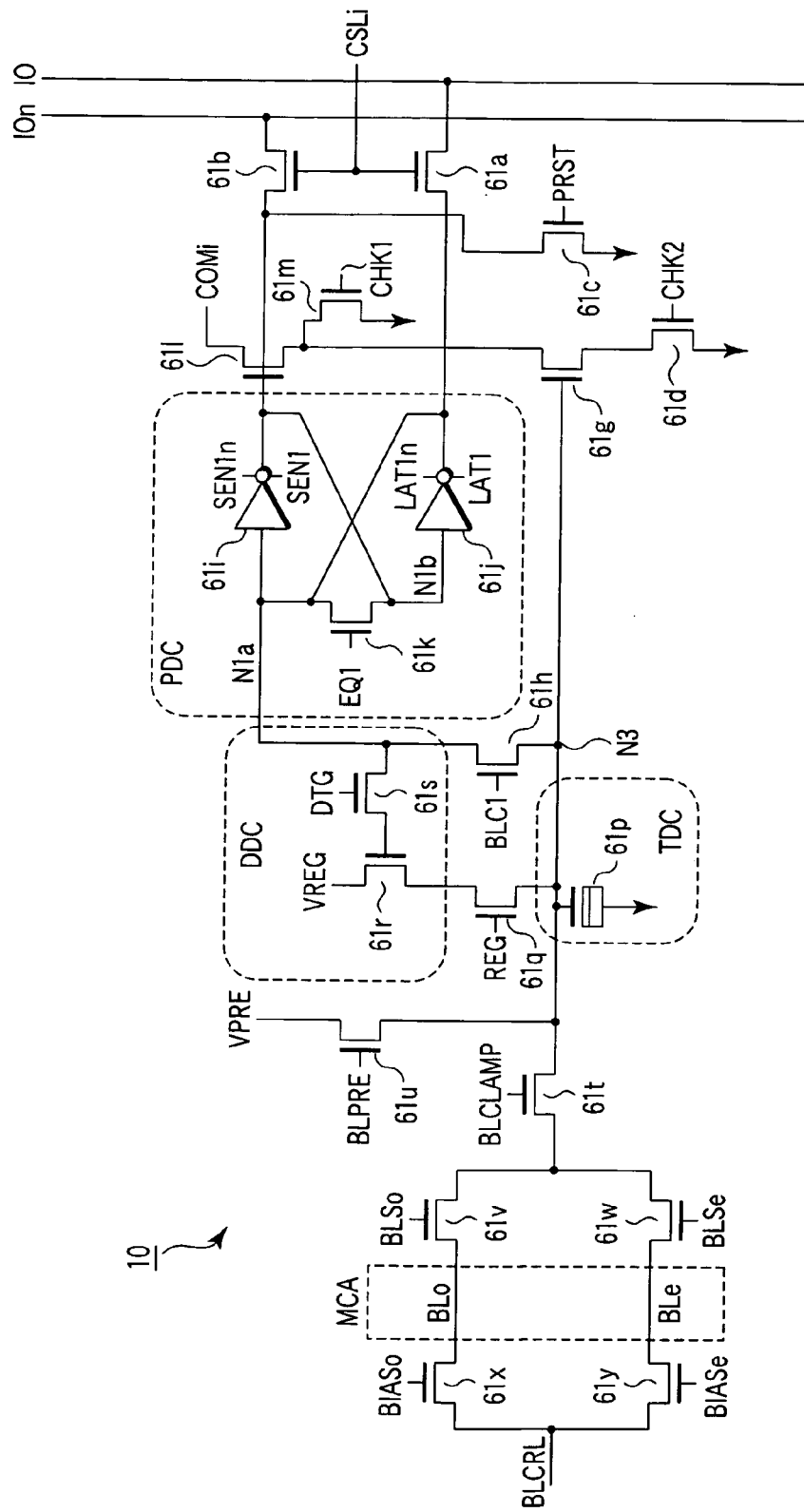
F I G. 1

FIG. 10A

| 0 | 0→1 | | | Data in memory cell |
|---|---|---|---|---|
| inhibit PDC DDC TDC | Write (OK) PDC DDC TDC | | Write (NG) PDC DDC TDC | |
| H H H | L L L | | H H L | Data load (write→L, inhibit→H in PDC) Copy the data in PDC into DDC |
| H H L | L L L | | H H L | Internal data load & Cache setting |

FIG. 10B

| 0 | 0→1 | | | Data in memory cell |
|---|---|---|---|---|
| inhibit PDC DDC TDC | Write (OK) PDC DDC TDC | | Write (NG) PDC DDC TDC | |
| H H H | L L L | | H H L | |
| H H L | L L L | | H H L | Program (write→L, inhibit→H in PDC) DDC→TDC, PDC→DDC, TDC→PDC |
| H H H | L L H | | L L L | Bit line precharging |
| H H L | L L H | | L L L | Verify read with a* |
| H H H | L H H | | L L L | When DDC is H, TDC=H |
| H H H | H H H | | L L L | PDC→DDC, TDC→PDC |
| | | | | Program |
| | 0→1 | | | Verify 1, First time |

| 0 inhibit PDC DDC TDC | 0→1 Write (OK) PDC DDC TDC | 0→1 Write (NG) PDC DDC TDC | Data in memory cell |
|---|---|---|---|
| H H H | L L | | Copy the data in DDC into PDC |
| H H H<br>H H H | L L<br>L L | | Program (PDCL write→L, inhibit→H)<br>DDC→TDC, PDC→DDC, TDC→PDC | Program |
| H L H<br>H H H<br>H H H | L L L<br>L L L<br>H L H | L L H<br>L L L<br>L L L | Bit line precharging<br>Verify read with a'<br>When DDC is H, TDC=H<br>PDC→DDC, TDC→PDC | 0→1 Verify 1, Second time |

FIG. 11

Second page write operation

| | 0 | | | | 0→3 | | | | 1 | | | | 1→2 | | | | Data in memory cell |
|---|---|---|---|---|---|---|---|---|---|---|---|---|---|---|---|---|---|
| | inhibit | | | | Write (OK) | | | | inhibit | | | | Write (NG) | | | | |
| | PDC | DDC | TDC | | PDC | DDC | TDC | | PDC | DDC | TDC | | PDC | DDC | TDC | | |
| | H | | | | L | | | | H | | | | L | | | | Data load (write→L, inhibit→H in PDC) |
| | H | H | L | | L | L | L | | H | H | L | | L | L | L | | Copy PDC into DDC |
| | H | H | L | | L | L | L | | H | H | H | | L | L | H | | Read at a |
| | H | H | L | | L | L | L | | H | L | H | | L | L | H | | If DDC=H, TDC=L |
| | H | L | L | | L | L | H | | H | L | L | | L | L | L | | Transfer the potential in TDC to PDC |
| | L | H | H | | L | L | H | | L | H | L | | L | L | L | | DDC→TDC, PDC→DDC, TDC→PDC |

FIG. 12A

Second page write operation

| | 0 | | | | 1 | | | | 1→2 | | | | Data in memory cell |
|---|---|---|---|---|---|---|---|---|---|---|---|---|---|
| | inhibit | | | | inhibit | | | | Write (OK) | | | Write (NG) | |
| | PDC | DDC | TDC | | PDC | DDC | TDC | | PDC | DDC | TDC | PDC DDC TDC | |
| | H | L | | | H | L | | | L | H | | H L | Program (write→L, inhibit→H in PDC) DDC→TDC, PDC→DDC, TDC→PDC |
| | H | L | H | | H | L | H | | H | H | H | H L H | When PDC is H, precharge bit line |
| | H | L | L | | H | L | L | | L | H | L | H L L | Verify read with b* |
| | H | L | H | | H | L | H | | H | H | H | H L H | When DDC is H, TDC=H |
| | L | H | H | | L | H | H | | L | L | H | H L H | PDC→DDC, TDC→PDC |
| | L | H | | | L | H | | | H | L | | H L | Bit line precharging PDC→DDC, TDC→PDC (only after Verify 2 is performed) |
| | L | H | H | | L | H | H | | H | L | H | L H H | Verify read with c* |
| | L | H | L | | L | H | L | | H | L | L | L H L | When DDC is H, TDC=H |
| | H | L | H | | H | L | H | | L | H | H | L H H | PDC→DDC, TDC→PDC |

FIG. 12B

Second page write operation

| | 0 | | 0→3 | | | | | 1 | | | 1→2 | | | | | Data in memory cell |
|---|---|---|---|---|---|---|---|---|---|---|---|---|---|---|---|---|
| | inhibit | | Write (OK) | | | Write (NG) | | inhibit | | | Write (OK) | | | Write (NG) | | |
| | PDC | DDC | PDC | DDC | TDC | PDC | DDC | TDC | PDC | DDC | TDC | PDC | DDC | TDC | PDC | DDC | TDC | |
| | H | L | L | L | | L | L | | H | L | | L | L | | H | H | | Bit line precharging |
| | H | L | L | L | | L | L | | H | L | | L | L | | H | H | | Read with b or b* |
| | H | L | L | L | H | L | L | H | H | L | H | L | L | H | H | H/L | When DDC=H, TDC=H |
| | L | H | H | H | L | L | L | L | L | H | L | H | L | L | L | H | Transfer the potential in TDC to PDC DDC→TDC, PDC→DDC, TDC→PDC |
| | L | H | H | H | H | L | L | H | L | H | H | H | L | H | L | H | DDC→inverted TDC, PDC→DDC TDC→PDC |
| | H | L | L | L | H | L | L | H | H | L | H | L | L | H | H | H | Internal data load & Cache setting, Second time |

FIG. 13A

Second page write operation

| | 0 | | | | | | | 1 | | | 1→2 | | | | | Data in memory cell |
|---|---|---|---|---|---|---|---|---|---|---|---|---|---|---|---|---|
| | inhibit | | Write (OK) | | | Write (NG) | | inhibit | | | Write (OK) | | | Write (NG) | | |
| | PDC | DDC | PDC | DDC | TDC | PDC | DDC | TDC | PDC | DDC | TDC | PDC | DDC | TDC | PDC | DDC | TDC | |
| | H | L | | | | | | | H | L | | L | L | | H | H | | Program (write→L, inhibit→H in PDC) PDC→TDC, PDC→DDC, TDC→PDC |
| | H | L | | | | | | | H | L | H | L | L | H | H | H | H | When PDC is H, precharge bit line Verify read with b' |
| | L | H | | | | | | | L | H | L | H | L | L | L | H | L | When DDC is H, TDC=H PDC→DDC, TDC→PDC |
| | H | L | | | | | | | H | L | | L | L | | H | H | | Bit line precharging PDC→DDC, TDC→PDC (only after Verify 2 is performed) Verify read with c' |
| | H | L | | | | | | | H | L | H | L | L | H | H | H | H | When DDC is H, TDC=H PDC→DDC, TDC→PDC |

| 0,1 | | | 2,3 | | | |
|---|---|---|---|---|---|---|
| PDC | DDC | TDC | PDC | DDC | TDC | Second page read |
| L | L | | H | H | | Read with b<br>TDC→PDC |
| L | | | H | | | |

FIG. 14B

| 0 | | | 1,2 | | | 3 | | | | |
|---|---|---|---|---|---|---|---|---|---|---|
| PDC | DDC | TDC | PDC | DDC | TDC | PDC | DDC | TDC | | |
| L | L | | L | L | | H | H | | Read with c<br>TDC→PDC | First page read 1 |
| L | L | | L | L | | H | H | | | |
| L | L | | L | L | | H | H | L | Read with a<br>PDC→DDC<br>When DDC is H, TDC=L<br>TDC→PDC | First page read 1 |
| L | L | | H | L | | L | L | | | |

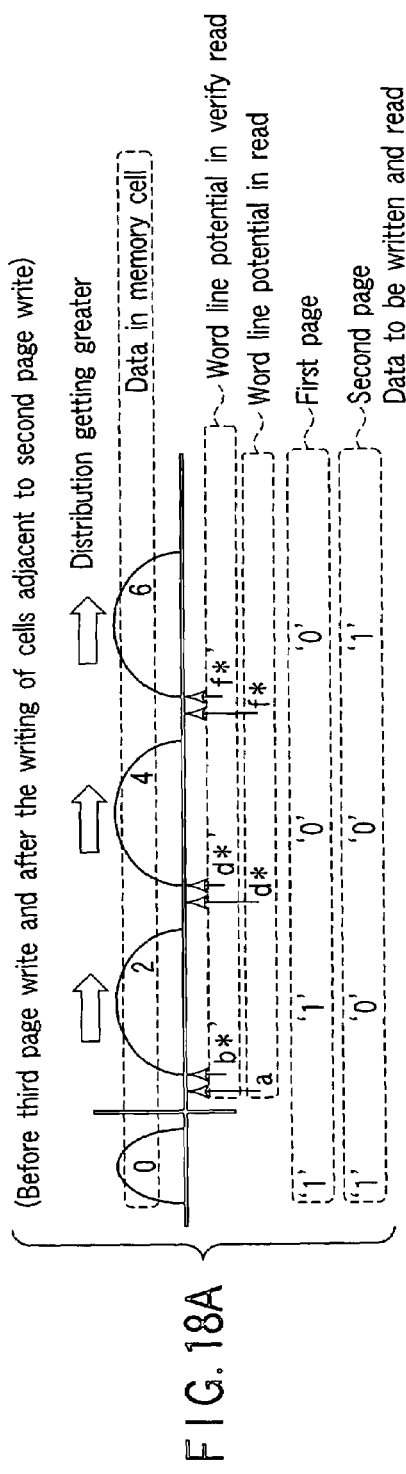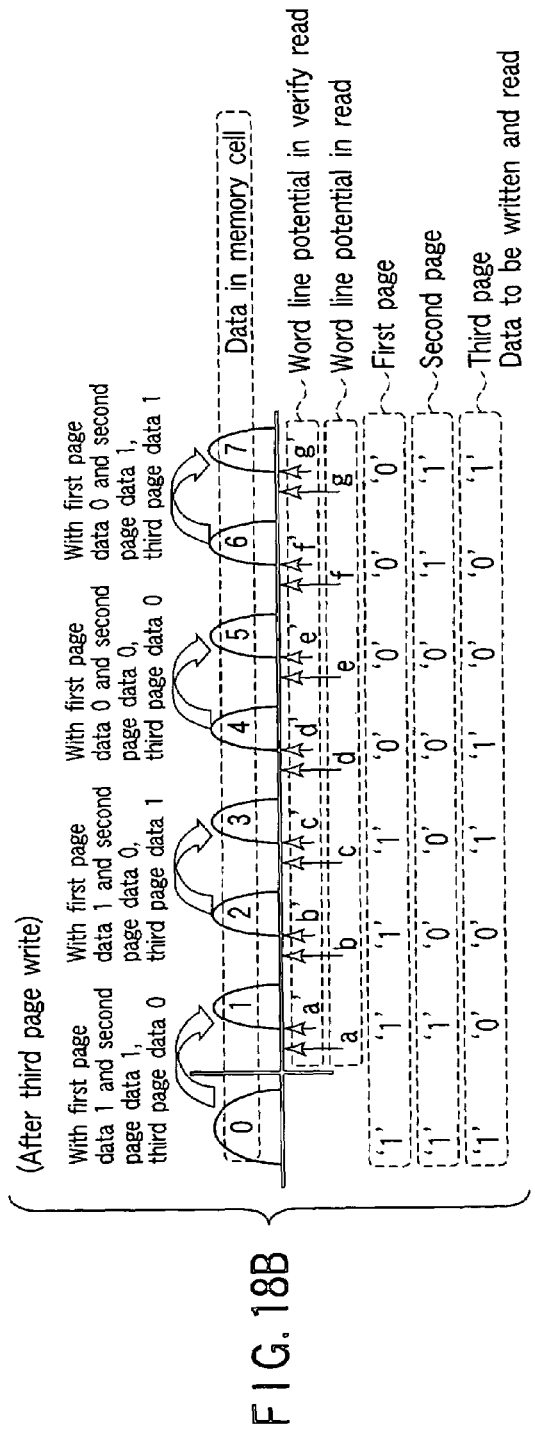
FIG. 18A
FIG. 18B

After internal read

| Data in memory cell | | | | |
|---|---|---|---|---|
| | 0 | 2 | 4 | 6 | |
| PDC | 0 | 1 | 1 | 1 | Data read in internal read |

After data cache setting

| Data in memory cell | | | | |
|---|---|---|---|---|
| | 0 | 2 | 4 | 6 | |
| PDC | 1 | 0 | 0 | 0 | 1 : writing unselected, 0 : writing |

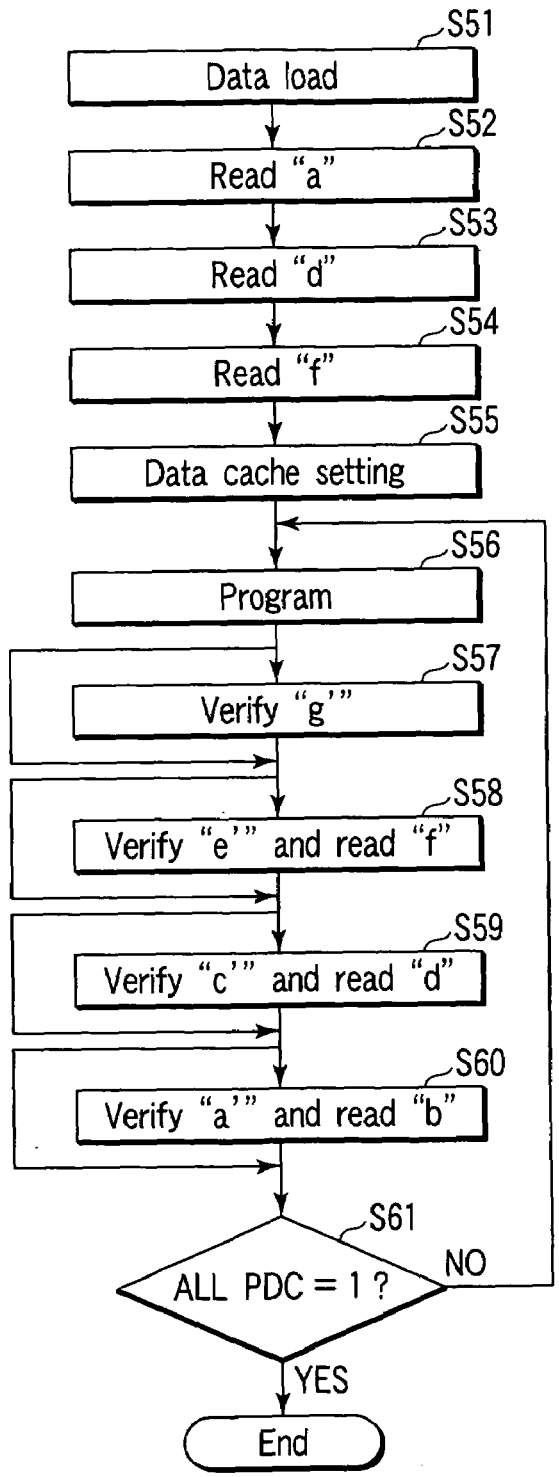
F I G. 21

After third page load

| | Data in memory cell after writing | | | | | | | |
|---|---|---|---|---|---|---|---|---|
| | 0 | 1 | 2 | 3 | 4 | 5 | 6 | 7 |
| PDC | 1 | 0 | 0 | 1 | 1 | 0 | 0 | 1 |
| | | | | | | | | Externally inputted data |

FIG. 23A

After data cache setting

| | Data in memory cell after writing | | | | | | | |
|---|---|---|---|---|---|---|---|---|
| | 0 | 1 | 2 | 3 | 4 | 5 | 6 | 7 |
| PDC | 1 | 0 | 1 | 0 | 1 | 0 | 1 | 0 |
| | | | | | | | | 1: writing unselected, 0: writing |

FIG. 23B

NONVOLATILE SEMICONDUCTOR MEMORY DEVICE

CROSS-REFERENCE TO RELATED APPLICATIONS

This is a Continuation Application of PCT Application No. PCT/JP2004/003785, filed Mar. 19, 2004, which was published under PCT Article 21 (2) in English.

This application is based upon and claims the benefit of priority from prior Japanese Patent Application No. 2003-383925, filed Nov. 13, 2003, the entire contents of which are incorporated herein by reference.

BACKGROUND OF THE INVENTION

1. Field of the Invention

This invention relates to a nonvolatile semiconductor memory device capable of storing, for example, two bits or more of data.

2. Description of the Related Art

A nonvolatile semiconductor memory device capable of storing multivalued data, such as a NAND flash memory using EEPROM, has been proposed (for example, refer to Jpn. Pat. Appln. KOKAI Publication No. 2000-195280).

In a NAND flash memory, all of or half of a plurality of cells arranged in the row direction are written into or read from simultaneously. The NAND cells constituting each NAND flash memory are connected via bit lines to a write and read latch circuit.

In a NAND flash memory which stores multivalued data, a threshold voltage according to the writing data is set in a memory cell, which enables a plurality of bits of data to be stored in the memory cell. To suppress the threshold voltage distribution, writing is done at a threshold voltage lower than the original threshold voltage in a first write operation. Then, in a second write operation, writing is done to the original threshold voltage. When data is written by this method, the writing data is not left in the data storage circuit after the first write operation. For this reason, after the first write operation, the writing data is read out in a read operation and then determined. However, the data written in the first write operation cannot be read accurately because it is lower than the original threshold voltage. To overcome this problem, it is necessary to store three bits of data, including the first writing data, the second writing data, and the data written in a lower page (a page preceding the page now being written into). A storage circuit for storing those data items is composed of, for example, two CMOS latch circuits and a precharge transistor for holding the data read from the memory cell in verifying the data bit by bit and forcing the data to be set to data "1". As a result, the storage circuit has the demerit of occupying a larger area. Therefore, there has been a need for a nonvolatile semiconductor memory device which is capable of eliminating a storage circuit for storing the data necessary for writing and of writing multivalued data with a simpler circuit configuration.

BRIEF SUMMARY OF THE INVENTION

According to a first aspect of the present invention, there is provided a nonvolatile semiconductor memory device comprising: a memory cell which stores a plurality of data items in n-valued (n is a natural number equal to one or more) threshold voltages; a first data storage circuit which is connected to the memory cell and which stores externally inputted data of a first logic level or a second logic level; a second data storage circuit which is connected to the memory cell and which stores the data of the first logic level or second logic level read from the memory cell; and a control circuit which controls the memory cell and the first and second data storage circuits and which manipulates the data stored in the first and second data storage circuits in the middle of writing data into the memory cell, reproduces the externally inputted data, and resumes writing data into the memory cell.

According to a second aspect of the present invention, there is provided a nonvolatile semiconductor memory device comprising: a memory cell which stores a plurality of data items in n-valued (n is a natural number equal to one or more) threshold voltages; a first data storage circuit which is connected to the memory cell and which stores externally inputted data of a first logic level or a second logic level; a second data storage circuit which is connected to the memory cell and which stores the data of the first logic level or second logic level read from the memory cell; and a control circuit which controls the memory cell and the first and second data storage circuits and which sets the logic level of the data stored in the second data storage circuit to the first logic level when the logic level of the externally inputted data is the second logic level, carries out a write operation of raising the threshold voltage of the memory cell when the logic level of the data stored in the first data storage circuit is the first logic level, sets the logic level of the data stored in the first data storage circuit to the second logic level when the memory cell has reached the first threshold voltage, holds the threshold voltage of the memory cell without changing the threshold voltage when the logic level of the data stored in the first data storage circuit is the second logic level, and continues writing until the logic level of the first data storage circuit has reached the second logic level, sets the logic level of the data stored in the first data storage circuit to the first logic level when the logic level of the data stored in the second data storage circuit is the second logic level, and carries out a write operation of raising the threshold voltage of the memory cell when the logic level of the data stored in the first data storage circuit is the first logic level, sets the data stored in the first data storage circuit to the second logic level when the memory cell has reached the second threshold voltage, and holds the threshold voltage of the memory cell without changing the threshold voltage when the logic level of the data stored in the first data storage circuit is the second logic level.

According to a third aspect of the present invention, there is provided a nonvolatile semiconductor memory device comprising: a memory cell which stores a plurality of data items in n-valued (n is a natural number equal to one or more); and a write circuit which writes data into the memory cell and which writes k-valued data at a threshold voltage a little lower than the original threshold voltage into the memory cell in a write operation of writing an i-th data item into the memory cell, writes (k+1)-valued or more-valued data into the memory cell in a j-th write operation, and sets the threshold voltage of the k-valued data before the j-th write operation.

According to a fourth aspect of the present invention, there is provided a nonvolatile semiconductor memory device comprising: a memory cell which stores a plurality of data items in n-valued (n is a natural number equal to one or more) threshold voltages; a first data storage circuit which is connected to the memory cell and which stores externally inputted data of a first logic level or a second logic level; a second data storage circuit which stores the data of the first logic level or second logic level read from the memory cell;

and a control circuit which controls the memory cell and the first and second data storage circuits and which, when writing the largest one of the data items to be written into the memory cell, writes the largest data item to the original threshold voltage in one write operation and writes the data items other than the largest one in a plurality of write operations.

According to a fifth aspect of the present invention, there is provided a nonvolatile semiconductor memory device comprising: a memory cell which stores n bits (n is a natural number equal to one or more) of data with a plurality of threshold voltages; a first data storage circuit which is connected to the memory cell and which stores externally inputted data of a first logic level or a second logic level; a second data storage circuit which stores the data of the first logic level or second logic level read from the memory cell; and a control circuit which controls the memory cell and the first and second data storage circuits and which writes data into the memory cell bit by bit in the n bits and raises the threshold voltage of the memory cell by writing the data in each bit in still another plurality of write operations.

BRIEF DESCRIPTION OF THE SEVERAL VIEWS OF THE DRAWING

FIG. 1 is a circuit diagram of a data storage circuit according to a first embodiment of the present invention;

FIGS. 10A and 10B show the relationship between each data cache and the data in the memory cell in the first page write operation;

FIG. 11 shows the relationship between each data cache and the data in the memory cell in the first page write operation;

FIGS. 12A and 12B show the relationship between each data cache and the data in the memory cell in the second page write operation;

FIGS. 13A and 13B show the relationship between each data cache and the data in the memory cell in the second page write operation;

FIG. 14A shows data stored in the data cache after the second page read operation and FIG. 14B shows data stored in the data cache after the first page read operation;

FIGS. 18A and 18B show the relationship between the data in a memory cell and the threshold voltage of the memory cell according to the third embodiment;

FIG. 21 is a flowchart showing a third page write operation related to the third embodiment;

FIGS. 23A and 23B show the data stored in the data cache as a result of the third page write operation of FIG. 21.

DETAILED DESCRIPTION OF THE INVENTION

Hereinafter, referring to the accompanying drawings, embodiments of the present invention will be explained.

First Embodiment

Figure 2:
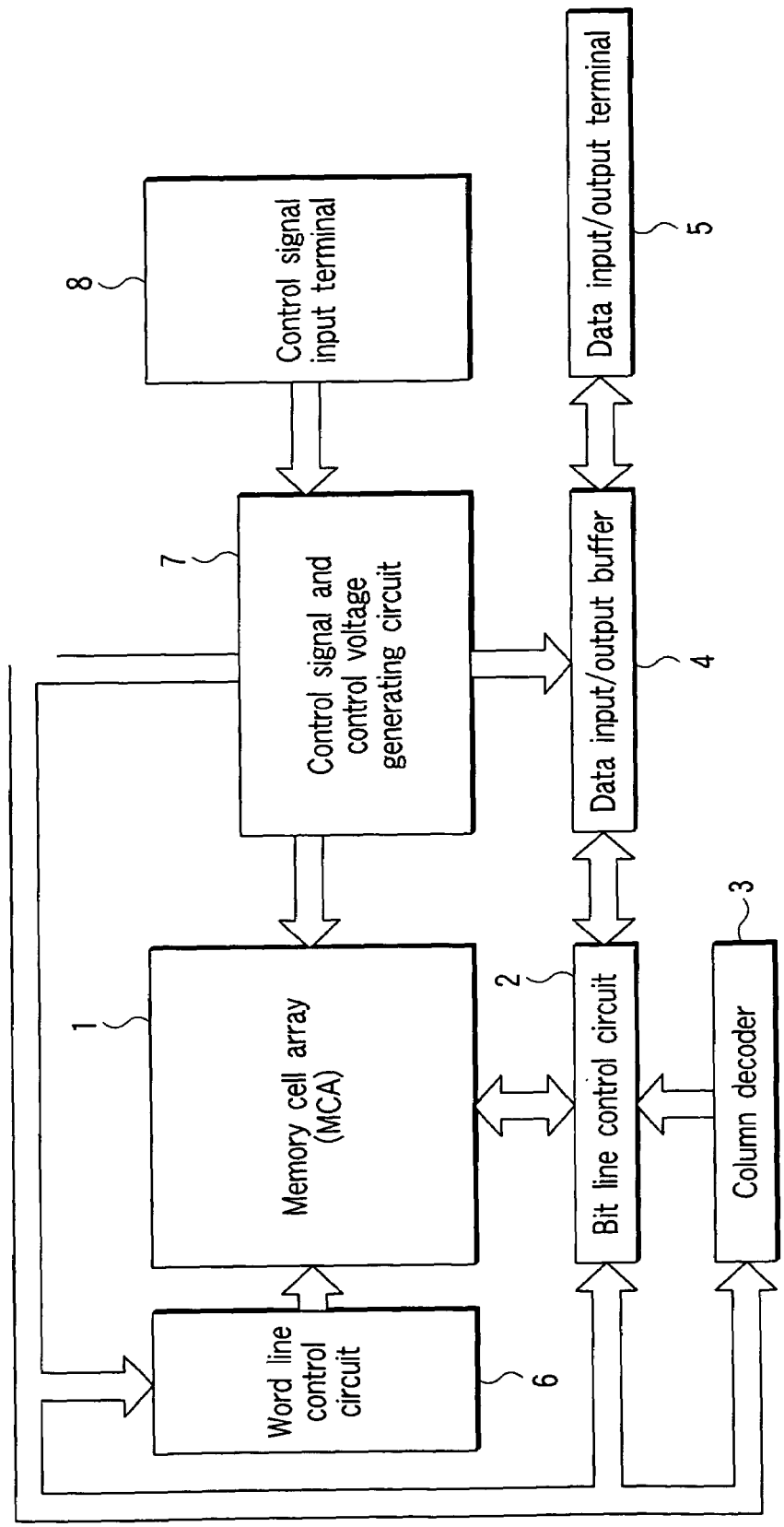
FIG. 2 is a schematic block diagram of a nonvolatile semiconductor memory device according to the present invention.

FIG. 2 schematically shows the configuration of a nonvolatile semiconductor memory device according to the present invention. For example, the configuration of a NAND flash memory which stores 4-valued (2 bits of) data is shown in FIG. 2.

A memory cell array 1 includes a plurality of bit lines, a plurality of word lines, and a common source line. In the memory array 1, for example, memory cells are arranged in a matrix. Each of the memory cells is composed of an EEPROM cell and enables data to be rewritten electrically. A bit control circuit 2 for controlling bit lines and a word line control circuit 6 are connected to the memory cell array 1.

The bit line control circuit 2 includes a plurality of data storage circuits as described later. The bit line control circuit 2 reads the data in a memory cell in the memory cell array 1 via a bit line, detects the state of a memory cell in the memory cell array 1 via a bit line, or writes data into a memory cell in the memory cell array 1 by applying a write control voltage to the memory cell via a bit line. A column decoder 3 and a data input/output buffer 4 are connected to the bit line control circuit 2. The data storage circuits in the bit line control circuit 2 are selected by the column decoder 3. The data in a memory cell read into a data storage circuit is outputted via the data input/output buffer 4 from a data input/output terminal 5 to the outside world.

Writing data externally inputted to the data input/output terminal 5 is inputted via the data input/output buffer 4 to the data storage circuit selected by the column decoder 3.

The word line control circuit 6 is connected to the memory cell array 1. The word line control circuit 6 selects a word line in the memory cell array 1 and applies a voltage necessary for reading, writing, or erasing to the selected word line.

The memory cell array 1, bit line control circuit 2, column decoder 3, data input/output buffer 4, and word line control circuit 6, which are connected to a control signal and control voltage generating circuit 7, are controlled by the control signal and control voltage generating circuit 7. The control signal and control voltage generating circuit 7, which is connected to a control signal input terminal 8, is controlled by a control signal externally inputted via the control signal input terminal 8.

The bit line control circuit 2, column decoder 3, word line control circuit 6, and control signal and control voltage generating circuit 7 constitute a write circuit and a read circuit.

Figure 3:
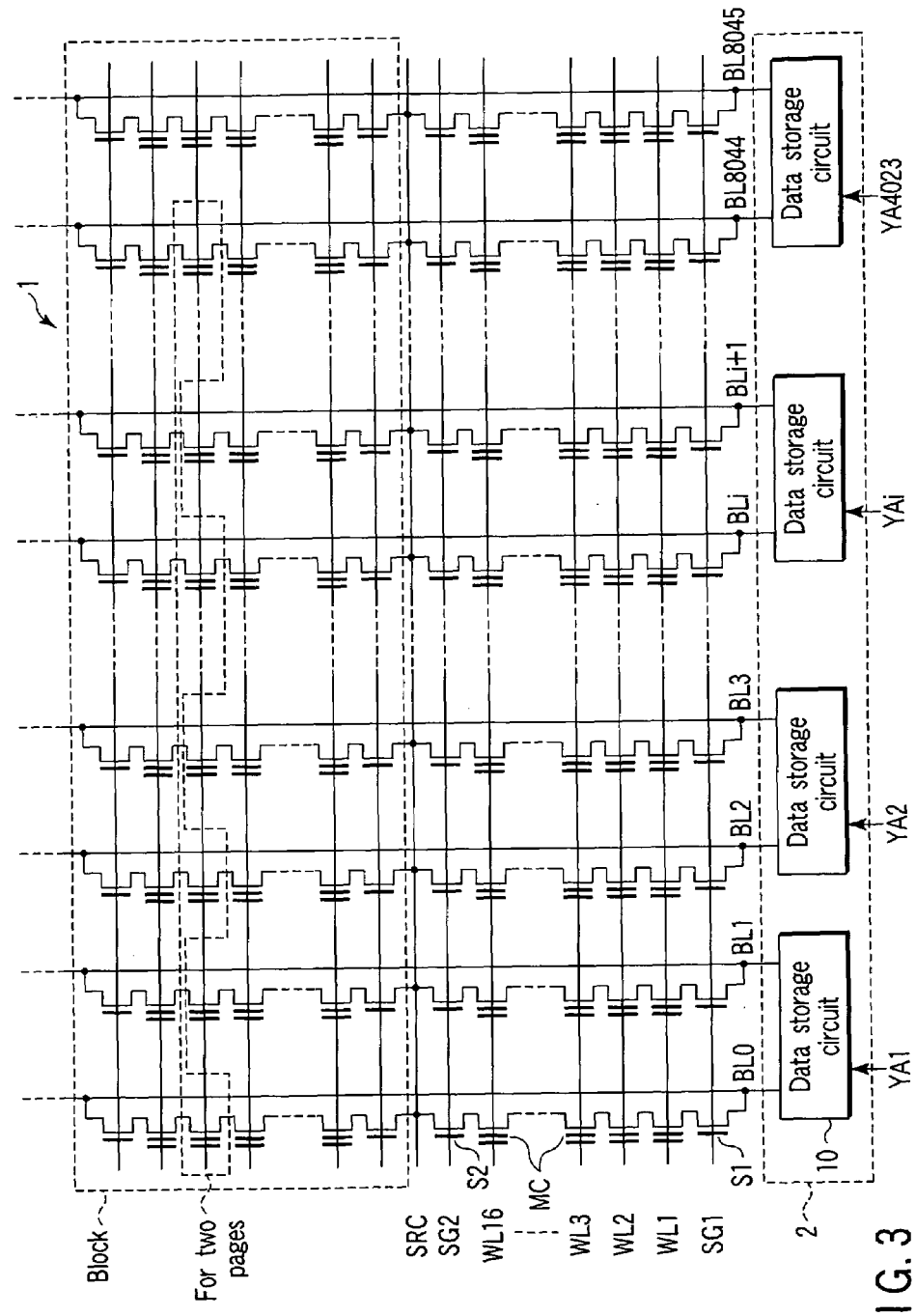
FIG. 3 is a circuit diagram showing the configuration of the memory cell array and bit-line control circuit shown in FIG. 2.

FIG. 3 shows the configuration of the memory cell array 1 and bit line control circuit 2 of FIG. 2. In the memory cell array 1, a plurality of NAND cells are provided. A NAND cell is composed of memory cells MCs (made up of, e.g., 16 EEPROMs) connected in series and a first and a second select gate S1, S2. The first select gate S1 is connected to bit line BL0 and the second select gate S2 is connected to source line SRC. The control gates of the memory cells arranged in each row are connected equally to word lines WL1, WL2, WL3, . . . , WL16. First select gates S1 are connected equally to select line SG1 and second select gates S2 are connected to select line SG2.

The memory cell array 1 includes a plurality of blocks as shown by the broken lines. Each block is composed of a plurality of NAND cells. The data is erased in blocks. An erase operation is performed simultaneously on the two bit lines connected the data storage circuit 10.

A plurality of memory cells (the memory cells enclosed by the broken line) provided every other bit line and connected to a single word line constitute a sector. Data is written or read in sectors. In a sector, for example, two pages of data are stored.

In a read operation, a program verify operation, and a program operation, one bit line is selected from the two bit lines (BLi, BLi+1) connected to the data storage circuit 10 according to the address signal (YA1, YA2, . . . , YAi, YA4023) externally specified. In addition, according to an external address, one word line is selected and one sector (for two pages) is selected. The switching between the two pages is effected according to the address.

Figure 4A:
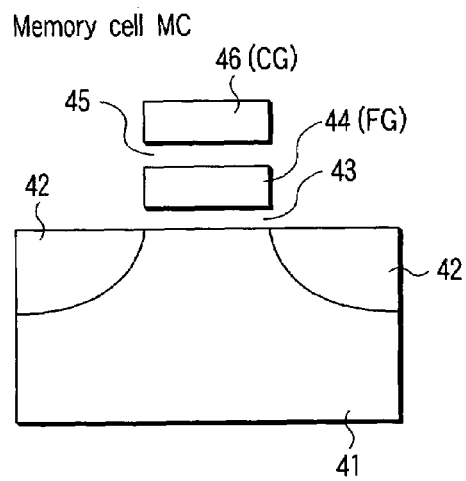
FIGS. 4A and 4B are sectional views of a memory cell and a select transistor, respectively.
Figure 4B:
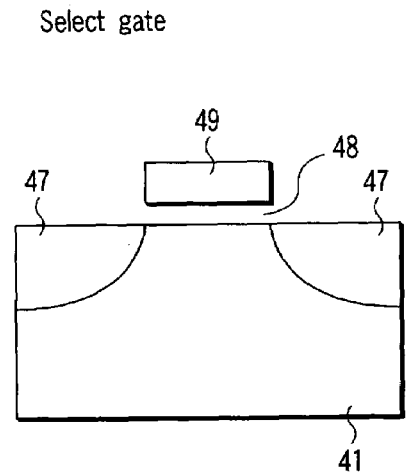

FIGS. 4A and 4B are sectional views of a memory cell and a select transistor, respectively. FIG. 4A shows a memory cell. In a substrate 41, an n-type diffused layer 42 acting as the source and drain of a memory cell is formed. Above the substrate 41, a floating gate (FG) 44 is formed via a gate insulating film 43. Above the floating gate 44, a control gate (CG) 46 is formed via an insulating film 45. FIG. 4B shows a select gate. In the substrate 41, an n-type diffused layer 47 acting as a source and a drain is formed. Above the substrate 41, a control gate 49 is formed via a gate insulating film 48.

Figure 5:
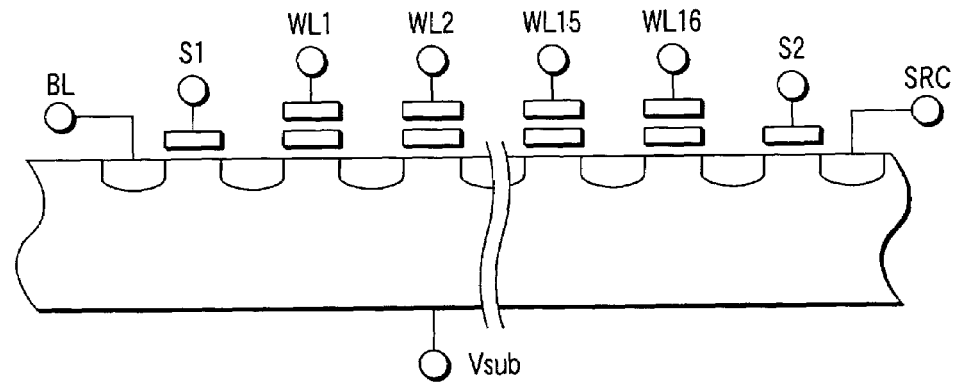
FIG. 5 is a sectional view of a NAND cell.

FIG. 5 is a sectional view of a NAND cell in the memory cell array. In this example, in the NAND cell, 16 memory cells MCs configured as shown in FIG. 4A are connected in series. The drain side and source side of the NAND cell are provided with a first select gate S1 and a second select gate S2 configured as shown in FIG. 4B, respectively.

FIG. 1 is a circuit diagram of the data storage circuit 10 shown in FIG. 3.

The data storage circuit 10 has a primary data cache (PDC), a dynamic data cache (DDC), a temporary data cache (TDC). The PDC and DDC hold the input data in a write operation, hold the read data in a read operation, hold the data temporarily in a verify operation, and are used to manipulate the internal data in storing multivalued data. The TDC not only amplifies the data on the bit line in reading the data and holds the data temporarily, but also is used to manipulate the internal data in storing multivalued data.

The PDC is composed of clocked inverter circuits 61$i$, 61$j$ and a transistor 61$k$. The transistor 61$k$ is connected between the input terminal of the clocked inverter circuit 61$i$ and the input terminal of the clocked inverter circuit 61$j$. A signal EQ1 is supplied to the gate of the transistor. The nodes N1$a$, N1$b$ serving as the input terminals of the clocked inverter circuits 61$i$, 61$j$ are connected via column select transistors 61$a$, 61$b$ to output data lines IO, IOn, respectively. A column select signal CSLi is supplied to the gates of the transistors 61$a$, 61$b$.

Furthermore, the node N1$b$ of the PDC is connected to the gate of a transistor 61$l$. A signal COMi is supplied to one end of the current path of the transistor 61$l$. The other end of the current path of the transistor 61$l$ is connected via a transistor 61$m$ to the ground. In addition, the other end of the current path of the transistor 61$l$ is connected via a transistor 61$g$ and a transistor 61$d$ to the ground. A signal CHK1 is supplied to the gate of the transistor 61$m$. The gate of the transistor 61$g$ is connected to a node N3 described later. A signal CHK2 is supplied to the gate of the transistor 61$d$.

The signal COMi, which is common to all of the data storage circuits 10, indicates whether all of the data storage circuits 10 have been verified. Specifically, as described later, if the verify operation has been completed, the nodes N1$a$ of the PDCs of all of the data storage circuits 10 go high. In this state, when the signals CHK1 and CHK2 are made high, if the verify operation has been completed, the signal COMi goes high.

Between the output terminal of the inverter circuit 61$i$ and the ground, a transistor 61$c$ is connected. A preset signal PRST is supplied to the gate of the transistor 61$c$. The transistor 61$c$, which operates according to the preset signal PRST, sets the node N1$b$ of the PDC at VSS (low level). That is, the node N1$a$ of the PDC is set at Vdd (high level).

The TDC is composed of, for example, a MOS capacitor 61$p$. The capacitor 61$p$ is connected between the junction node N3 of transistors 61$g$, 61$h$ and the ground. The DDC is connected via transistors 61$q$, 61$h$ to the junction node N3. A signal REG is supplied to the gate of the transistor 61$q$. A signal BLC1 is supplied to the gate of the transistor 61$h$.

The DDC is composed of transistors 61$r$, 61$s$. A signal VREG is supplied to one end of the current path of the transistor 61$r$. The other end of the transistor 61$r$ is connected to the current path of the transistor 61$q$. The gate of the transistor 61$r$ is connected via the transistor 61$s$ to the node N1$a$ of the PDC. A signal DTG is supplied to the gate of the transistor 61$s$.

Furthermore, one end of the current path of transistors 61$t$, 61$u$ is connected to the junction node N3. A signal VPRE is supplied to the other end of the current path of the transistor 61$u$. A signal BLPRE is supplied to the gate of the transistor 61$t$. A signal BLCLAMP is supplied to the gate of the transistor 61$t$. The other end of the current path of the transistor 61$t$ is connected via a transistor 61$v$ to one end of bit line BLo and via a transistor 61$w$ to one end of bit line BLe. The other end of the bit line BLo is connected to one end of the current path of a transistor 61$x$. A signal BlASo is supplied to the gate of the transistor 61$x$. The other end of the bit line BLe is connected to one end of the current path of a transistor 61$y$. A signal BlASe is supplied to the gate of the transistor 61$y$. A signal BLCRL is supplied to the other ends of the current paths of the transistors 61$x$, 61$y$. The transistors 61$x$, 61$y$ are turned on so as to complement the transistors 61$v$, 61$w$ according to signals BlASo, BlASe, thereby supplying a signal BLCRL to the unselected bit lines.

Each of the above signals and voltages is generated by the control signal and control voltage generating circuit 7 of FIG. 2. Under the control of the control signal and control voltage generating circuit 7, the operation below will be carried out.

The memory, which is a multivalued memory, enables two bits of data to be stored in one cell. The switching between the two bits is effected according to the address (a first page, second page).

(Description of Operation)

With the above configuration, the operation will be explained.

Figure 6A:
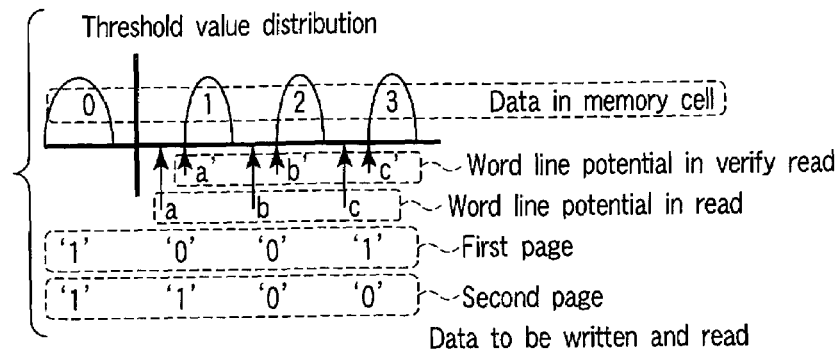
FIGS. 6A, 6B, and 6C show the relationship between the data in a memory cell and the threshold voltage of the memory cell.

FIG. 6A shows the relationship between the data in a memory cell and the threshold voltage of the memory cell. When an erase operation is carried out, the data in the memory cell becomes "0." When a first page is written into, the data in the memory cell becomes data "0" and data "1." After a second page is written into, the data in the memory cell becomes data "0" to "3." In the first embodiment, the data in the memory cell is defined as taking a lower threshold value to a higher one.

(Program and Program Verify)

In a program operation, first, an address is specified, thereby selecting the two pages of FIG. 3. In the memory, of the two pages, programming can be done only in this order: the first page and then the second page. Therefore, first, the first page is selected according to the address. In recent years, a writing method with one program sequence including two program operations has been used in order to narrow the threshold voltage distribution in a write operation of a multivalued flash memory which stores a plurality of bits. With this method, in a first program operation, a verify potential lower than the original threshold voltage is set and a write and verify operation is carried out. After the first program operation is passed, a second program operation is carried out. In the second program operation, the verify potential is set to the original value and a write and verify operation is carried out. In the method, the memory cell written into is written into again and a threshold voltage a little higher than the threshold voltage at which the preceding writing was done is set. This makes the degree of variability of the threshold voltage in a write operation small, with the result that the threshold voltage distribution is small. In the case of a NAND flash memory, of a plurality of cells connected to the same word line, half of them are written into simultaneously. Therefore, in a write verify loop, many cells have lower threshold voltages in the first verify operation. Thus, the source line is floating. The cells which have been written into first have their threshold voltages determined in this state. Then, after the other cells have been written into, the source line is fixed to a specific potential. As a result, it seems that the threshold voltages of the cells first written into have gotten lower, which prevents the threshold voltage distribution from widening. An increment ΔVpgm in the write voltage in the first write operation is made larger and an increment ΔVpgm in the write voltage in the second write operation is made smaller, thereby speeding up the write operation.

Figure 8:
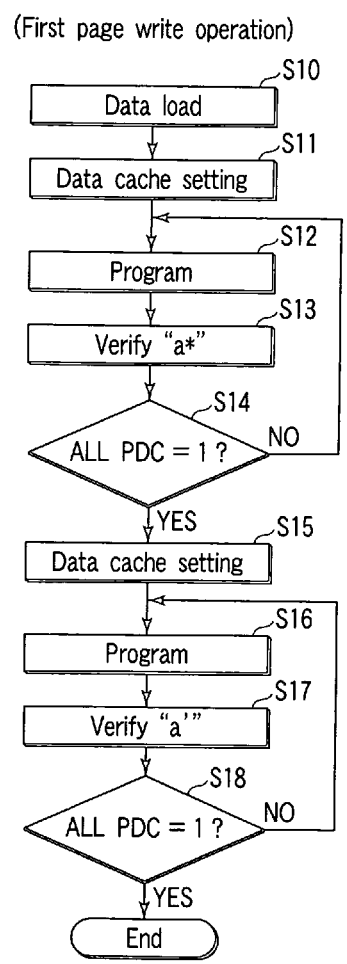
FIG. 8 is a flowchart showing a first page write operation.
Figure 9:
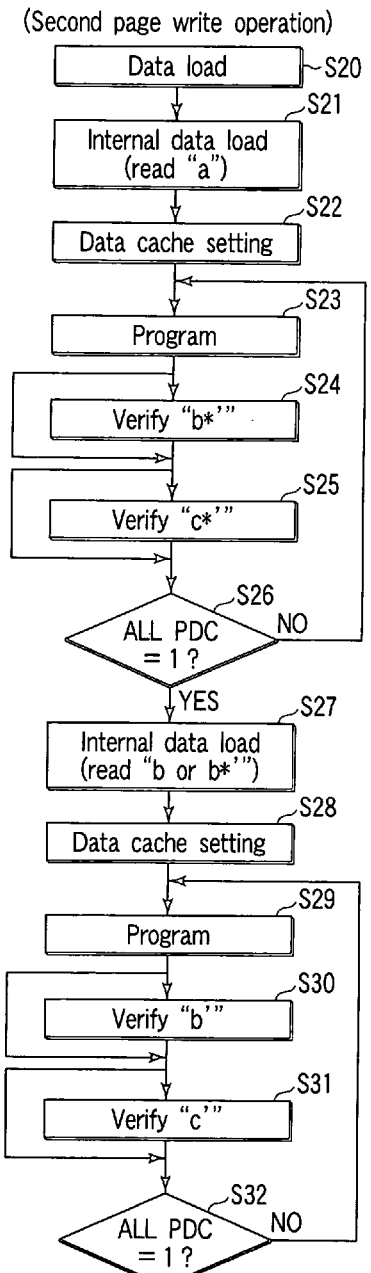
FIG. 9 is a flowchart showing a second page write operation.

In the first embodiment, too, a program operation is performed using the above method. FIG. 8 shows a first page write operation and FIG. 9 shows a second page write operation. Both of the first and second page write operations include two program and verify operations. FIGS. 10A, 10B, and 11 show the contents of each data cache in the first page write operation. FIGS. 12A, 12B, 13A, and 13B show the contents of each data cache in the first page write operation. In the figures, "L" means the low level and "H" means the high level.

(First Page Write Operation)

First, the first page write operation will be explained by reference to FIGS. 8, 10A, 10B, and 11.

(First Page Data Load) (S10)

First, writing data is externally inputted and is stored in the PDCs of all of the data storage circuits 10. When data "1" meaning that no writing is done is externally inputted, the node N1a of the PDC shown in FIG. 1 is set to the high level. When data "0" meaning that writing is done is externally inputted, the node N1a of the PDC is set to the low level. Hereinafter, it is assumed that the data in the PDC is the potential at the node N1a and the data in the DDC is the gate potential of the transistor 61r.

(First Page Data Cache Setting) (S11)

When a write command is inputted, the signal DTG goes high for a moment and the transistor 61s constituting the DDC is turned on for a moment. As a result, the data in the PDC is copied into the DDC via the transistor 61s. Therefore, the gate potential of the transistor 61r goes high (FIG. 10A).

(First Page Program for the First Time) (S12)

Next, the potential of the signal BLC1, BLCLAMP, BLSo, or BLSe is set to Vdd+Vth (Vdd: power supply voltage (e.g., 3 V or 1.8 V, however, not restricted to this voltage), Vth: the threshold voltage of the n-channel MOS transistor). Then, the transistor 61h turns on. As a result, when data "1" meaning that the PDC is not to be written into is stored in the PDC, the bit line goes to Vdd. When data "0" meaning that the PDC is to be written into is stored in the PDC, the bit line goes to Vss (ground potential). The cells in the unselected pages (their bit lines unselected) connected to the selected word line must not be written into. For this reason, the bit lines connected to those cells are set to Vdd as is data "1". Here, when Vdd is supplied to the select line SG1 of the selected block, Vpgm (20 V) is supplied to the selected word line, and Vpass (10 V) is supplied to the unselected word lines, if the bit line is at Vss, writing is done because the channel of the cell is at Vss and the word line is at Vpgm. On the other hand, if the bit line is at Vdd, Vpgm causes the channel of the cell to be at about Vpgm/2 through coupling. This prevents the memory cells whose bit lines are at Vdd from being programmed.

Figure 6B:
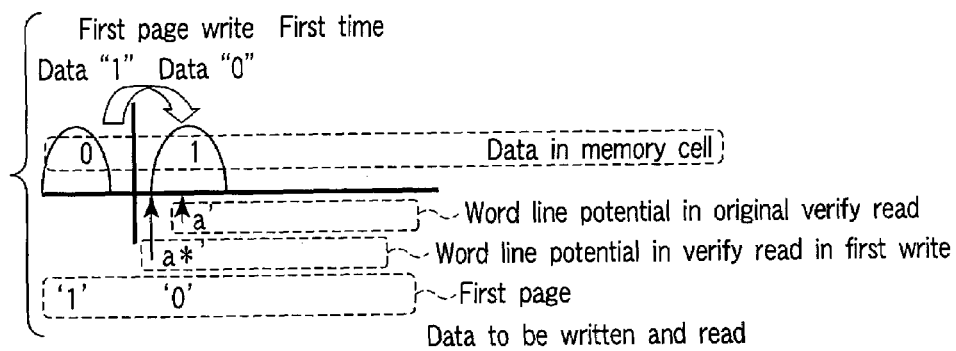

As shown in FIG. 6B, when the data in the first page is "0," the data in the memory cell is set to "1." When the data in the first page is "1," the data in the memory cell remains at "0."

After the writing is completed, the word lines at the potentials Vpgm and Vpass are returned to the original ones. In this recovery operation, the operation below is carried out.

(Exchange of Data Between PDC and DDC)

The signal BLPRE is set at Vdd temporarily and the signal VPRE is set at Vssw, thereby setting the TDC at Vss. Then, the signal VREG is set at Vdd and the signal REG is made high temporarily, thereby turning on the transistor 61q. If the DDC has stored the high level, the transistor 61r turns on, which sets the TDC at Vdd via the transistors 61r, 61q. If the DDC has stored the low level, the transistor 61r is off, with the result that the TDC remains at Vss. By this operation, the data in DDC is copied into the TDC. Next, the signal DTG is made high temporarily, thereby copying the data in the PDC into the DDC. Thereafter, the signal BLC1 is made high temporarily, thereby copying the data in the TDC into the PDC. As a result, the data in the PDC moves to the DDC and the data in the DDC moves to the PDC (FIG. 10B).

(First Page Program Verify for the First Time) (S13)

In a first page program verify, a verify potential of "a*'" is applied to the selected word line as shown in FIG. 6B. The original verify potential "a'" is made a little higher than the read level. However, the first verify potential "a*'" for the first page program is made a little lower than the original verify potential "a'".

Next, a voltage of Vread is supplied to the unselected word lines in the selected block and to the select line SG1, and the signal VPRE is set to Vdd, the signal BLPRE is set to Vdd+Vth, the signal BLCLAMP is set to, for example, 1 V+Vth in the data storage circuit of FIG. 1, thereby precharging the bit line to, for example, 1 V. Thereafter, the select line SG2 on the source side of the cell is made high. When the threshold voltage of the cell is higher than "a*'", the cell turns off. Therefore, the bit line remains high. When the threshold voltage of the cell has not reached "a*'", the cell turns on. Therefore, the bit line goes to Vss.

Thereafter, the signal BLCLAMP is set to Vss, the signal VPRE is set to Vdd, and the signal BLPRE is set to Vdd+Vth, thereby charging the TDC to Vdd. Then, the signal BLCLAMP is set to, for example, 1 V+Vth. Then, if the bit line is at the low level, the TDC goes to the low level. If the bit line is at the high level, the TDC remains high.

Here, when writing is done, the low level is stored in the DDC. When writing is not done, the high level is stored in the DDC. For this reason, when the signal VREG is set at Vdd and the signal REG is made high temporarily, if writing is not done, the TDC is forced to go to the high level. Thereafter, the signal DTG is made high temporarily, thereby copying the data stored in the PDC into the DDC. Then, with the signal BLC1 at the high level, when the cell has reached the threshold voltage "a*'" or when writing is not done, the high level is latched in the PDC. Only when the threshold voltage of the cell has not reached "a*'", the low level is latched in the PDC (FIG. 10B).

When the PDC is at the low level, the write operation is carried out again and the program operation and verify operation are repeated until the data in all of the PDCs have reached the high level (S14 to S12). At this time, the voltage Vpgm of the program is increased in steps of, for example, +0.4 V.

In this way, when the data in all of the PDCs are high, a second write operation of the first page is executed.

(First Page Data Cache Setting for the Second Time) (S15) (FIG. 11)

In a state where the data in all of the PDCs are at the high level, the same operation as described above is executed and the data in the PDC is replaced with the data in the DDC. That is, the data stored in the DDC is transferred to the PDC. The data in the DDC is the data originally stored in the PDC. When writing is not done, the DDC holds data "1." When writing is done, the DDC holds data "0."

Figure 6C:
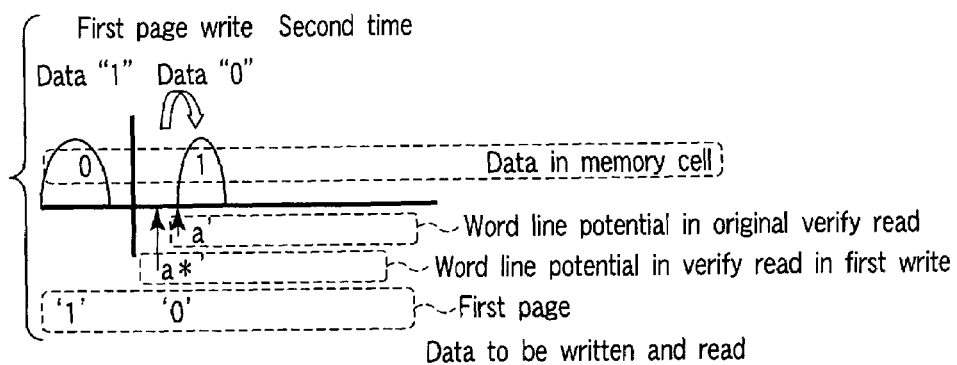

In this state, a second first-page program (S16) and a second first-page program verify (S17) are executed as in the above operation. Here, the verify level in the verify operation is "a'", the original verify level (FIG. 6C).

Thereafter, when the PDC is at the low level, the write operation is carried out again and the program operation and verify operation are repeated until the data in all of the PDCs have reached the high level (S18 to S16) (FIG. 11). At this time, an increment ΔVpgm in the voltage Vpgm of the program is made smaller than the first program operation and is increased in steps of, for example, +0.2 V.

In this way, after the data in the first page is written, the data in the second page is written.

(Second Page Write Operation)

Next, a second page write operation will be explained by reference to FIGS. 9, 12A, 12B, 13A, and 13B.

(Second Page Data Load) (S20)

As in the first page program, in the second page program, writing data is externally inputted and stored in the PDCs of all of the data storage circuits 10.

(Internal Data Load for the First Time) (S21) (FIG. 12A)

Figure 7A:
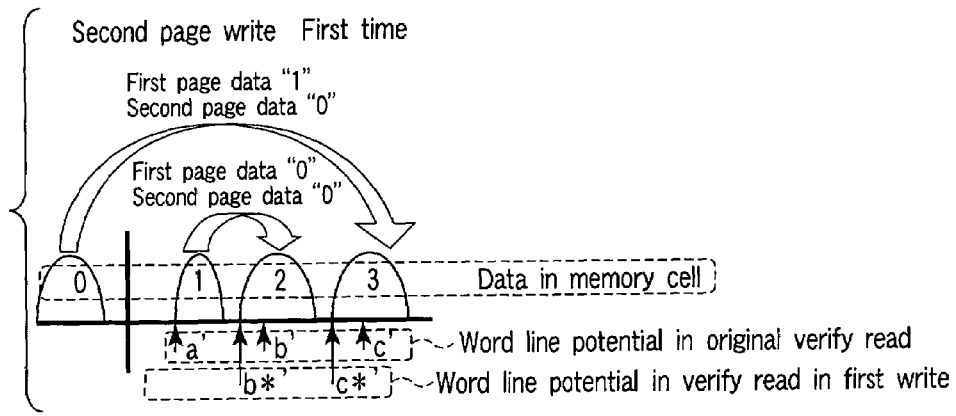
FIGS. 7A and 7B show the relationship between the data in a memory cell and the threshold voltage of the memory cell.

As shown in FIG. 7A, in a case where the data in the memory cell is "0" as a result of the first page write operation (or where the first page has not been written into), when the data in the second page is "0" (meaning that writing is to be done), the data in the memory cell is set to "3"; and when the data in the second page is "1" (meaning that writing is not to be done), the data in the memory cell is allowed to remain "0." In addition, in a case where the data in the memory cell is "1" as a result of the first page write operation (or where the first page write has been written into), when the data in the second page is "0" (meaning that writing is be done), the data in the memory cell is set to "2"; and when the data in the second page is "1" (meaning that writing is not to be done), the data in the memory cell is allowed to remain "1." Therefore, it is necessary to make a check to see if the data in the memory cell is "0" or "1", before the data in the second page is written into the memory cell.

To do this, a potential of "a" is applied to the word line, thereby carrying out a read operation in an internal data load operation as shown in FIG. 6A. Next, the read potential Vread is supplied to the unselected word lines in the selected block and the select line SG1 and a potential similar to that in the first page write operation is supplied to the signals VPRE, BLPRE of the data storage circuit 10, thereby precharging the bit line. Thereafter, the select line SG2 on the source side of the cell is made high. When the threshold voltage of the memory cell is higher than "a," the cell turns off, with the result that the potential of the bit line remains high. On the other hand, when the threshold voltage of the memory cell is lower than "a," the cell turns on, with the result that the potential of the bit line is at Vss. While the bit line is being discharged, the signal DTG is set to the high level temporarily, thereby copying the data in the PDC into the DDC (FIG. 12A).

Next, as in the first page write operation, after the TDC is charged to Vdd, the signal BLCLAMP is set to, for example, 1 V+Vth, thereby turning on the transistor 61t. When the potential of the bit line is at the low level (or when the data in the memory cell is "0"), the TDC goes to the low level; and when the potential of the bit line is at the high level (or when the data in the memory cell is "1"), the TDC remains high.

When writing is done, the low level is latched in the DDC. When writing is not done, the high level is latched in the DDC. Therefore, when the signal VREG is set to Vss and the signal REG is made high temporarily, if writing is not done, the transistors 61r, 61q turn on, forcing the TDC to go to the low level. Thereafter, the DTG is made high temporarily, thereby copying the data in the PDC into the DDC. Then, when the signal BLC1 is made high, it is only when data "2" is written into the memory cell that the high level is latched in the PDC. When data is not written into the second page or when data "3" is written into the memory cell, the PDC goes to the low level.

Thereafter, an exchange of the data between the PDC and the DDC is made and the writing data is latched in the PDC. Only when data "2" is written into the memory cell, the high level is latched in the DDC.

(Second Page Program for the First Time) (S23) (FIG. 12B)

In a first second-page program, when the high level is latched in the PDC in the same operation as the first first-page program, data is not written into the memory cell. When the low level is latched in the PDC, data is written into the memory cell.

When the writing has been completed, the potentials of the word lines set at Vpgm and Vpass are returned to the original potentials. During the recovery operation, an exchange of the data between the PDC and the DDC is made as in the first-page program.

(First Second-page Program Verify: Verification of Data "2") (S24)

In the second page program verify operation, when it is verified whether data "2" has been written into the memory cell in the same manner as in the first first-page program verify operation, the verification cannot be made correctly. Specifically, since the threshold voltage of a cell in which data "3" has been written is higher than the threshold voltage of a memory cell in which data "2" has been written, even when data "2" has been written insufficiently, the data is passed. Therefore, the data "2" is verified as described below.

Whether data "2" has been written into the memory cell is verified as follows. As shown in FIG. 7A, a verify potential of "b*'" is supplied to the selected word line. The original verify potential "b" for data "2" is made a little higher than the read level. However, the first verify potential "b*'" in a program verify operation is a little lower than the original verify potential "b'."

Next, the read potential Vread is supplied to the unselected word lines in the selected block and the select line SG1 and the signal BLC1 of the data storage circuit of FIG. 1 is set to Vdd+Vth. In addition, the transistors 61$t$ and 61$v$ or 61$w$ are turned on, thereby precharging the bit line. It is only the bit line to which a memory cell into which data "2" has been written is connected that is precharged. That is, when the high level has been latched in the PDC, the bit line is precharged. Thereafter, the select line SG2 on the source side of the cell is made high. When the threshold voltage is higher than "b*'," the cell turns off. Therefore, the potential of the bit line remains at the high level. When the threshold voltage "b*'" has not been reached, the cell turns on, with the result that the potential of the bit line goes to Vss.

Thereafter, the TDC is charged to Vdd as described above. Then, the specific voltage is supplied to the signal BLCLAMP for making transistor 61$t$. When the potential of the bit line is low, the TDC goes low. When the potential of the bit line is high, the TDC remains high. As shown in FIG. 12B, when writing is done, the low level is latched in the DDC. When writing is not done, the high level is latched in the DDC. Therefore, when the signal VREG is set to Vcc and the signal REG is made high temporarily, if writing is not done, the TDC is forced to go to the high level. Thereafter, the DTG is made high temporarily, thereby copying the data in the PDC into the DDC. Then, when the signal BLC1 is made high, it is when the cell has reached the threshold voltage or when writing is not done that the high level is latched in the PDC. In addition, it is when data "2" has been written into the memory cell and the threshold voltage "b*'" has not been reached that the low level is latched in the PDC.

(First Second-page Program Verify: Verification of Data "3") (S25)

Whether data "3" has been written into the memory cell is verified with a verify level of "c*'" as in the first first-page program verify operation. The verify level "c*'" is set a little lower than the level "c'" in the original verify read. After data "2" is verified, data indicating whether to write or not is latched in the PDC. When data "2" is written into the memory cell, the high level is latched in the DDC. Therefore, before the verification, the following operation is carried out, thereby making an exchange of the data between the PDC and the DDC.

(Exchange of Data Between PDC and DDC) First, the signal BLPRE is set to Vdd temporarily and the signal VREG is set to Vss, thereby setting the TDC to Vss. Next, the signal VREG is set to Vdd and the signal REG is made high temporarily, if the DDC is at the high level, the TDC is at Vdd. If the DDC is at the low level, the TDC remains at Vss. That is, the data in the DDC is copied into the TDC. Next, the signal DTG is made high temporarily, thereby copying the data in the PDC into the DDC. Thereafter, the signal BLC is made high temporarily, thereby copying the data in the TDC into the PDC. As a result, the data stored in the PDC is transferred to the DDC and the data stored in the DDC is transferred to the PDC.

When the PDC is at the low level, the write operation is carried out again and the program operation and verify operation are repeated until the data in all of the PDCs has reached the high level (S26 to S23). At this time, the program voltage Vpgm is increased in steps of, for example, +0.4 V.

(Second Internal Data Load) (S27) (FIG. 13A)

Figure 7B:
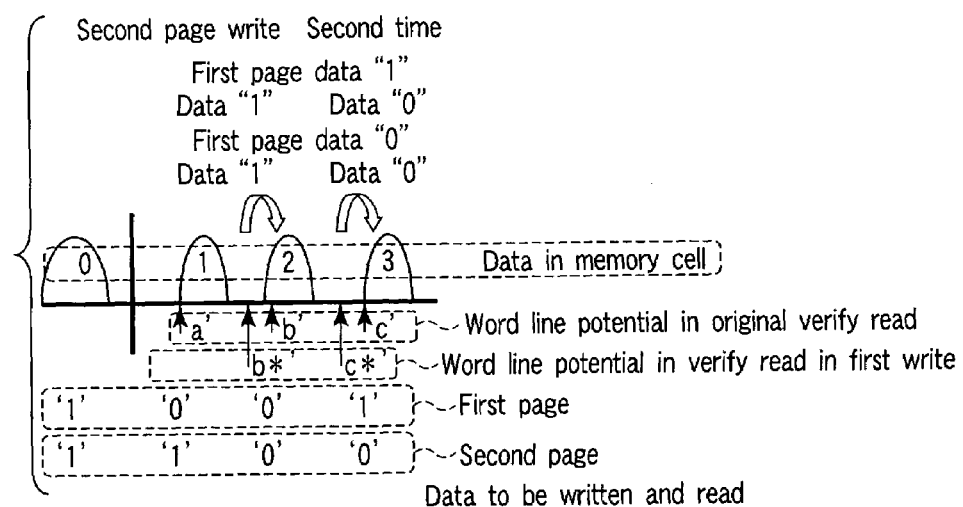

As shown in FIG. 7A, in a first program, data "2" and data "3" are written into the memory cell. The threshold voltages of data "2" and data "3" are set lower than the original threshold voltage. Therefore, in a second program, data "2" and data "3" are written to the proper threshold voltage as shown in FIG. 7B. However, after the first program and program verify have been completed, the data in all of the PDCs have reached the high level, with the result that the writing data disappears. Therefore, a read operation is carried out to see if data "2" or data "3" has been written into the memory cell.

First, a read potential of "b" ("b"<"b'") or the first verify potential "b*'" is supplied to the word line WL, thereby carrying out a read operation (S27). From this, it is determined whether the memory cell is a cell into which data "2" and data "3" have been written. However, a cell into which data "2" has been written has been written only to the threshold voltage "b*'" lower than the original one. For this reason, a cell into which data "2" has been written might not be found. However, since in a cell into which data "2" has been written, the DDC is also at the high level as shown in FIG. 12B, a cell into which data "2" has been written can be recognized.

A concrete operation of a second internal data load is as follows. First, the read potential "b" is supplied to the selected word line. Then, the read potential Vread is supplied to the unselected word lines in the selected block and the select line SG1. The voltage in precharging the bit line is supplied to the signals VPRE, BLPRE of the data storage circuit 10, thereby precharging the bit line. Thereafter, the select line SG2 on the source side of the cell is made high. When the threshold voltage of the memory cell is higher than "b" or "b*," the cell turns off. Therefore, the potential of the bit line remains high. On the other hand, when the threshold voltage of the memory cell is lower than "b" or "b*'," the cell turns on, with the result that the potential of the bit line goes to Vss.

Next, after the TDC is charged to Vdd, the aforementioned potential is supplied to the signal BLCLAMP, thereby enabling the potential of the bit line to pass through via the transistor 61*t*. When the potential of the bit line is at the low level, the TDC goes to the low level. When the potential of the bit line is at the high level (the threshold voltage of the memory cell is higher than "b" or "b*'"), the TDC goes to the high level. In a case where data "2" is written into the memory cell, the high level is latched in the DDC. In other cases, the low level is latched in the DDC (FIG. 13A). Therefore, when the signal VREG is set to Vdd and the signal REG is made high temporarily, if the data "2" is written into the memory cell, the TDC is forced to go high. Thereafter, when the signal BLC1 is made high, it is only when data "2" is written into the memory cell or when data "3" is written into the memory cell that the high level is latched in the PDC.

(Second-page Data Cache Setting for the Second Time) (S28)

When data is written into the second page, the high level is latched in the PDC. When data is not written into the second page, the low level is latched in the PDC. Therefore, the data in the PDC must be inverted. To do this, the following operation is carried out.

(Exchange of Data Between PDC and DDC)

First, the signal BLPRE is set to Vdd temporarily and VPRE is set to Vss, thereby setting the TDC to Vss. Next, the signal VREG is set to Vdd and the signal REG is made high temporarily. When the DDC is at the high level, the TDC goes to Vdd. When the DDC is at the low level, the TDC remains at Vss. That is, the data in the DDC is copied into the TDC. Next, the signal DTG is made high temporarily, thereby copying the data in the PDC into the DDC. Thereafter, the signal BLC1 is made high temporarily, thereby copying the data in the TDC into the PDC.

(Exchange of Data Between PDC and DDC: Transfer of Inverted Data from DDC to PDC)

First, the signal BLPRE is set to Vdd temporarily and the signal VPRE is set to Vdd, thereby setting the TDC to Vdd. Next, the signal VREG is set to Vss and the signal REG is made high temporarily. When the DDC is at the high level, the TDC goes to Vss. When the DDC is at the low level, the TDC remains at Vdd. That is, the data in the DDC is inverted and copied into the TDC. Next, the signal DTG is made high temporarily, thereby copying the data in the PDC into the DDC. Therefore, the signal BLC1 is made high temporarily, thereby copying the data in the TDC into the PDC. As a result, the writing data stored in the PDC is reversed and transferred to the PDC and the data stored in the DDC remains unchanged. Therefore, when the second page is written into, the low level is latched in the PDC. When the second page is not written into, the high level is latched in the PDC.

(Second Page Program for the Second Time) (S29) (FIG. 13B)

The second second-page program operates in the same manner as the first second-page program. That is, when the high level is latched in the PDC, the second page is not written into. When the low level is latched in the PDC, the second page is written into.

(Verify Operation of Data "2" and Data "3" for the Second Time) (S30, S31)

In the second page program, a second verify operation of data "2" and data "3" is the same as the first verify operation of data "2" and data "3" except for the verify potential. Specifically, in the second verify operation, the original verify potentials "b'" and "c'" are applied to the word line as shown in FIG. 7B.

When the PDC is at the low level as a result of the verify operation, the write operation is carried out again and the program operation and verify operation are repeated until the data in all of the PDCs have reached the high level (S32 to S29). At this time, an increment in the program voltage Vpgm is made smaller than the first ΔVpgm. For example, when the program voltage is increased in units of +0.4 V in the first verify operation, the program voltage is increased in units of +0.2 V in the second verify operation.

In the second write operation, the data is written into the memory cell as shown in FIG. 7B.

(Read Operation)

(Second Page Read) (FIG. 14A)

In a second page read operation, the potential "b" in a read operation is applied to the selected word line. Next, the read potential Vread (e.g., 4.5 V) is applied to the unselected word lines in the selected block and the select line SG1. The signal VPRE is set to Vdd and a specific voltage is supplied to the signal BLPRE, BLCLAMP, thereby setting the TDC of the data storage circuit 10 to the high level as described above and precharging the bit line. Thereafter, the select line SG2 on the source side of the cell is made high. When the threshold voltage of the memory cell is higher than "b," the cell turns off, with the result that the bit line remains high. On the other hand, when the threshold voltage of the memory cell has not reached "b," the cell turns on, with the result that the bit line goes to Vss. The data in the memory cell and the threshold voltage of the memory cell are defined as shown in FIG. 6A. Therefore, when the data in the memory cell is "0", "1", the TDC goes to the low level. When the data in the memory cell is "2", "3", the TDC remains at the high level.

Next, the potential of the TDC is transferred to the PDC. When the data in the memory cell is "0", "1", the low level is latched in the PDC. When the data in the memory cell is "2", "3", the high level is latched in the PDC (FIG. 14A). The data read from the PDC onto the data line IO is inverted at, for example, the data input/output buffer 4. Therefore, when the data in the memory cell is "0", "1", the resulting data is data "1." When the data in the memory cell is "2", "3", the resulting data is data "0." The above operation is the same as reading from a memory that stores binary data.

(First Page Read) (FIG. 14B)

When the data outputted in the first page read operation is "1," as shown in FIG. 6A, the data in the memory cell lie in separate regions, "0" and "3." Therefore, it is necessary to determine whether the data in the memory cell is "2" or less, or "3" and then determine whether the data in the memory cell is "0", or "2" or more.

(Read Operation (1))

First, it is determined whether the data in the memory cell is "2" or less, or "3." To do this, a read potential of "c" is applied to the word line, thereby reading the data in the memory cell onto the bit line. The read-out data is stored in the TDC and then transferred to the PDC. As a result, it is only when the data in the memory cell is "3" that the high level is latched in the PDC. In addition, it is when the data in the memory cell is "0", "1", "2" that the low level is latched in the PDC.

(Read Operation (2))

Next, it is determined whether the data in the memory cell is "1", or "2" or more. To do this, a read potential of "a" is applied to the word line, thereby reading the data in the memory cell onto the bit line. As a result, when the data in the memory cell is "0," the potential of the bit line goes to the low level. When the data in the memory cell is "1", "2", "3", the potential of the bit line goes to the high level.

While the bit line is being discharged, the signal DTG is made high temporarily, thereby transferring the data in the PDC to the DDC. Then, after the potential of the bit line is transferred to the TDC, the signal VREG is set to Vss and the signal REG is made high temporarily. When the DDC is at the high level, the TDC is forced to go to the low level. As a result, when the data in the memory cell is "0", "3", the TDC goes to the low level. When the data in the memory cell is "1", "2", the TDC goes to the high level.

Next, these TDC's potentials are read into the PDC. When the data in the memory cell is "0", "3", the low level is latched in the PDC. When the data in the memory cell is "2", "3", the high level is latched in the PDC. The data read from the PDC onto the data line IO is inverted at, for example, the data input/output buffer 4. Therefore, when the data in the memory cell is "0", "3", data "1" is outputted. When the data in the memory cell is "1", "2", data "0" is outputted.

In the first embodiment, the data storage circuit 10 has the PDC, DDC, and TDC. The externally inputted writing data is manipulated at the PDC, DDC, and TDC, which reproduces the data. As a result, a data cache for holding writing data need not be provided, which reduces the size of the circuit configuration.

Furthermore, after the writing data is loaded into the data storage circuit 10, the same data need not be loaded again. Consequently, the write operation can be made faster.

Second Embodiment

Next, a second embodiment of the present invention will be explained.

In the first embodiment, at the time of the second-page program, two write operations have been carried out by the pass write method in each of the operation of writing data "2" and the operation of writing data "3." However, when data "3" is written, writing may be done to the original threshold voltage "c'" in the first write operation in the second page program and only data "2" may be written by the pass write method in the second write operation.

Figure 15:
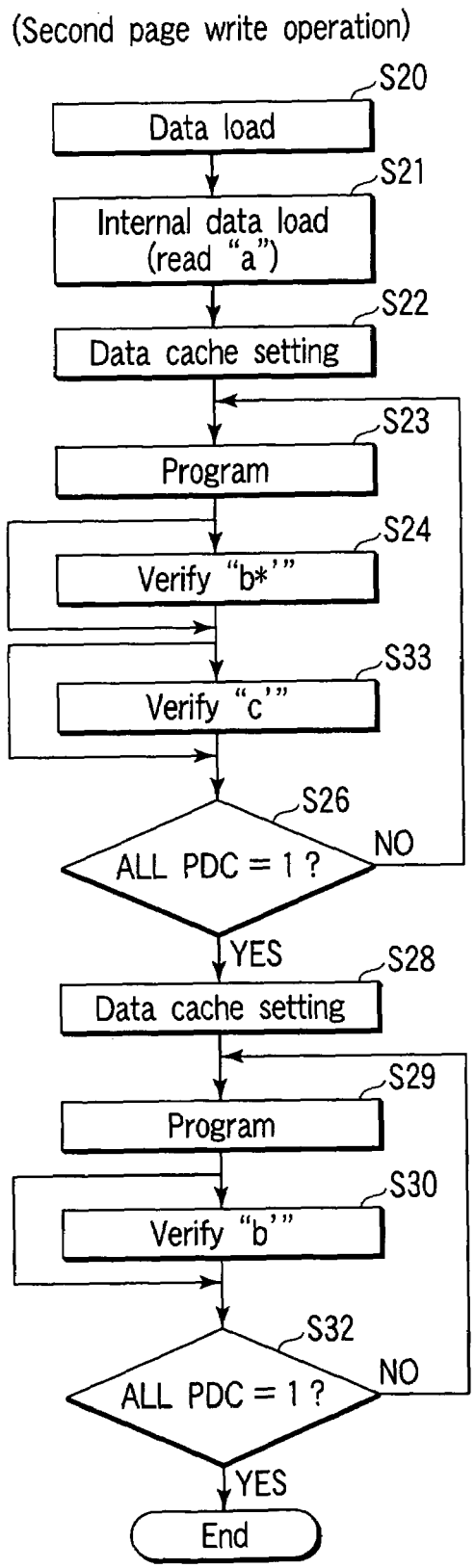
FIG. 15, which shows a second embodiment of the present invention, is a flowchart showing a second page program operation.

FIG. 15 shows the second embodiment. In FIG. 15, the same parts as those in FIG. 9 are indicated by the same reference numerals. FIG. 15 shows only the second page program operation.

A first second-page program, a program for data "2" is written to "b*'" a little lower than the original threshold voltage as in the first embodiment. In contrast, a program for data "3" is written to the original threshold voltage "c'." Therefore, to verify data "3," "c'" is supplied as a verify potential to the word line (S25). In this way, data "3" is written to the original threshold voltage.

Since data "3" has been written to the original threshold voltage, only data "2" is written in the second second-page program. After the first program, the externally inputted writing data is not left in the data storage circuit 10. However, when data "2" has been written, the DDC is at the high level after the first write operation (FIG. 13A). Therefore, the data in the DDC is reversed and transferred to the PDC, thereby enabling the data in the PDC to be used as writing data (S28). Therefore, an internal data load, that is, a read operation using the read potential "b" or "b*'" in the first embodiment can be omitted.

As described above, after the data cache is set, a second program is carried out (S29). This program is for setting data "2" to the original threshold voltage. Therefore, only a verify operation using the verify potential "b'" is executed. When all of the PDCs go high as a result of the program and verify operation, the write operation is completed.

In the second embodiment, since data "3" is written to the original threshold voltage in one program operation, the threshold voltage distribution of data "3" widens. However, the number of verify operations of data "3" is reduced, which enables high-speed writing.

Furthermore, after the first second-page program, the data in the DDC is inverted and transferred to the PDC, which enables the second program to be executed using the data in the PDC as writing data. Therefore, an internal load, that is, a read operation using the read potential "b" or "b*'" in the first embodiment can be omitted. Consequently, the program time can be shortened.

In the second embodiment, when data "3," the largest one of the 4-valued data, is written, writing is done in one program. However, data written in one program is not limited to data "3." Specifically, even when data larger than 4-valued one is written, the second embodiment may be applied to writing the largest one of the writing data items.

Third Embodiment

Next, a third embodiment of the present invention will be explained. In the first and second embodiment, 4-valued data has been written. Using the data storage circuit 10 configured as shown in FIG. 1, data larger than 4-valued (2 bits of) data may be stored in the memory cell.

An algorithm for writing data larger than 4-valued data will be explained. The following writing method has been proposed in order to prevent the threshold voltage of the memory cell from fluctuating as a result of the data in adjacent cells being varied due to the capacitance between floating gates.

For example, in a 4-valued memory cell in which data is defined as "0", "1", "2", "3" in ascending order of threshold voltage, when the first page is written into, a cell with data "0" is set to "2" with a threshold voltage of "2*'" lower than the original transistor. Then, after the first page of the adjacent cells is written into, "2*'" is returned to the original threshold voltage "2." When the threshold voltage of the cell rises due to the capacitance between the floating gates (FG-FG) of the adjacent cells, the threshold voltage does not change much in writing to the original threshold voltage "2." When the threshold voltage does not rise due to the FG-FG capacitance, the threshold voltage rises in writing to the original threshold voltage "2", with the result that the threshold voltage becomes constant. In the third embodiment, an example of 8-valued data in a write operation will be explained.

A schematic configuration of a nonvolatile semiconductor memory device according to the third embodiment is the same as that of each of the first and second embodiments.

Figure 16:
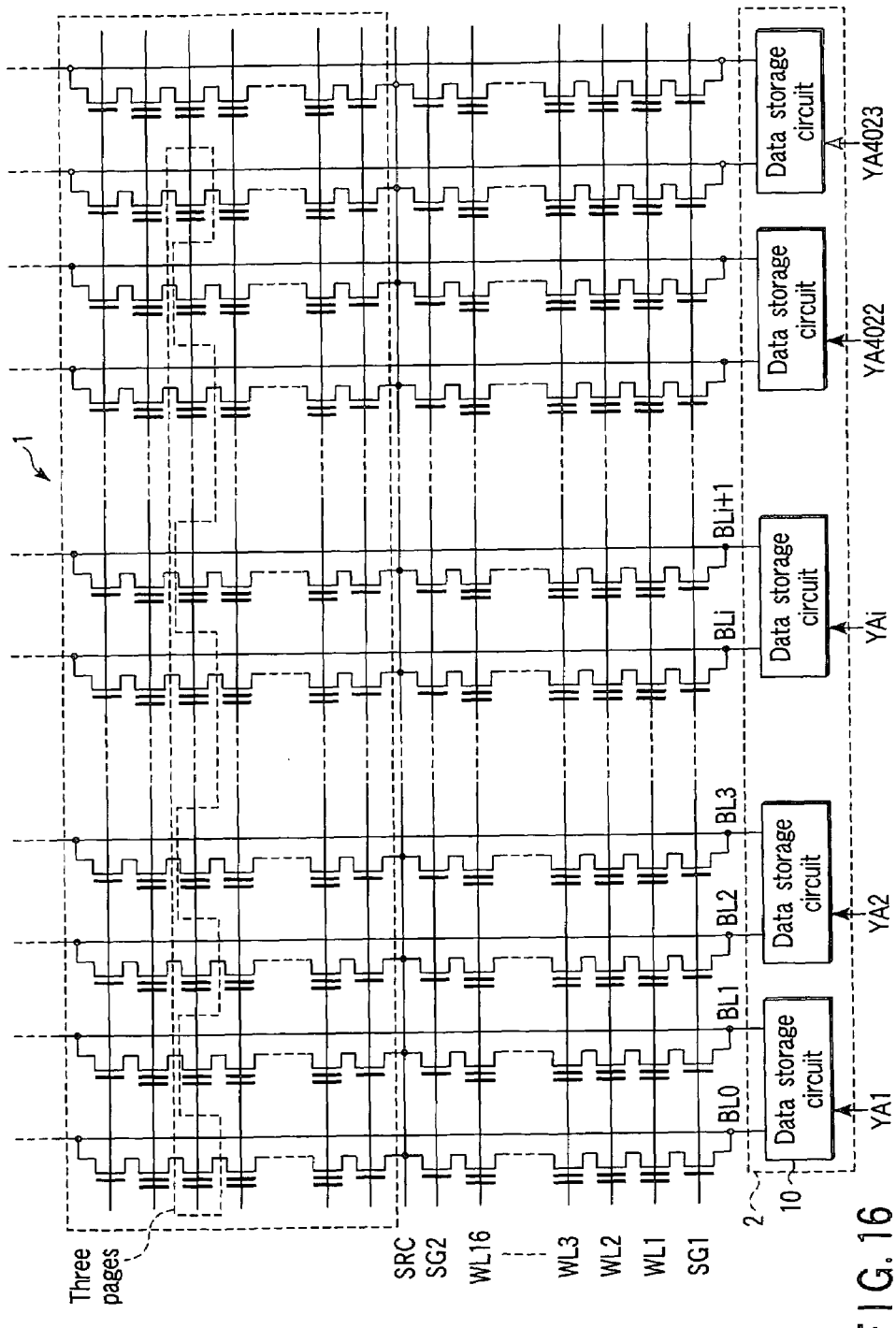
FIG. 16 shows a configuration of a memory cell array and a data storage circuit applied to a third embodiment of the present invention.

FIG. 16 shows the configuration of a memory cell array and a data storage circuit. The configuration of the memory cell array and data storage circuit is almost the same as that of FIG. 3 except that 3 bits of data are stored in each memory cell.

Figures 19, 22A, 22B:
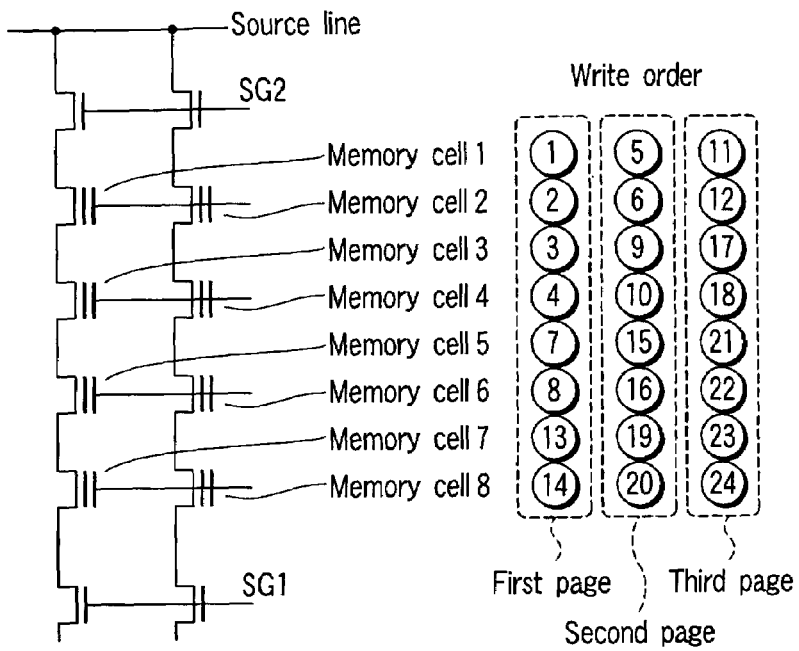
FIG. 19, which is related to the third embodiment, shows the order of writing data into a memory cell.
FIGS. 22A and 22B show the data stored in the data cache as a result of the third page write operation of FIG. 21.

FIGS. 17A, 17B, 17C, 18A, and 18B show operations in the third embodiment. FIG. 19 shows the order in which the memory cells are written into. In FIG. 19, for convenience's sake, one NAND cell is composed of four memory cells connected in series.

FIG. 18B shows the correspondence between the threshold voltage and data in a memory cell in the case of 8-valued data. In the case of 8-valued data, the data in the memory cell is set to, for example, "0", "1", "2,"..., "7" in ascending order of threshold voltage. When the data in the memory cell is erased, the data in the memory cell becomes "0." When the first page is written into, the data in the memory cell becomes "0" or "4." When the second page is written into, the data in the memory cell becomes "0", "2", "4", "6." Furthermore, When the third page is written into, the data in the memory cell becomes "0", . . . , "7."

Figures 17A, 17B, 17C:
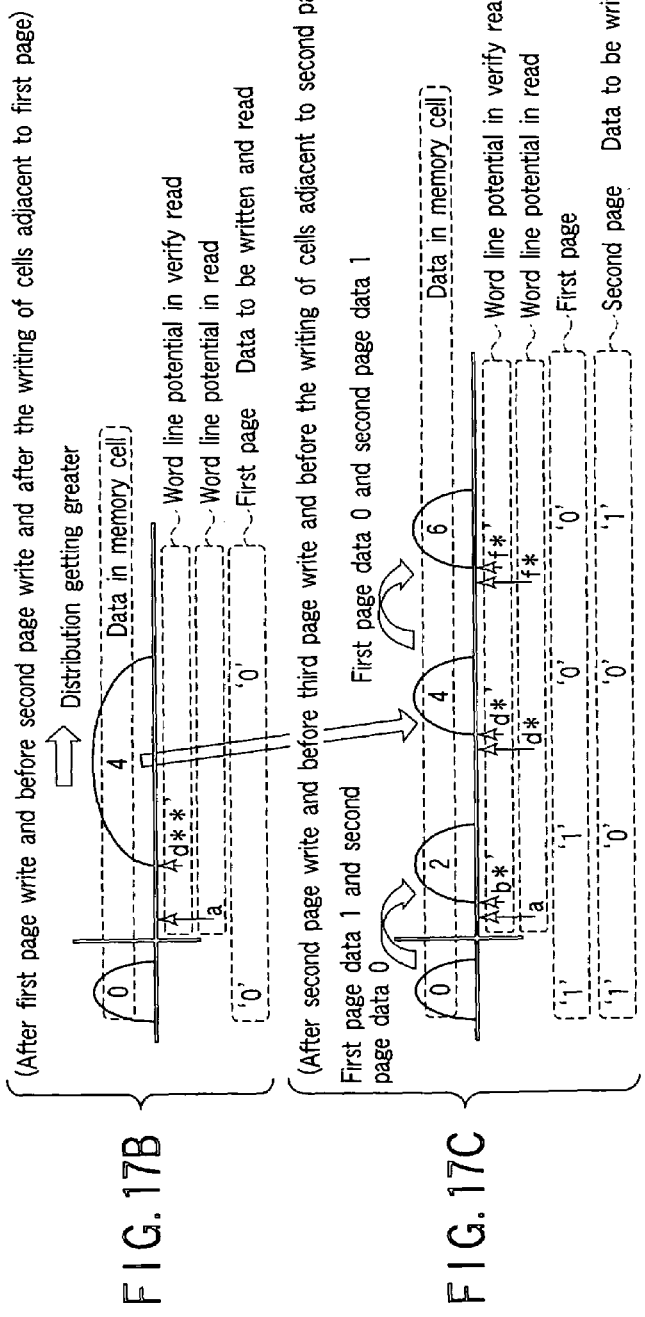
FIGS. 17A, 17B, and 17C show the relationship between the data in a memory cell and the threshold voltage of the memory cell according to the third embodiment.

For the sake of simplification, as shown in FIG. 17C, explanation will be given about a case where an additional one bit of data is written into a memory cell into which 4-valued or 2 bits of data have been stored.

FIG. 17A shows a state before the data in the second page is written after the data in the first page is written (after write orders 1 to 4 in FIG. 19). FIG. 17B shows a state after the data in the first page is written into adjacent cells. Since these write operations are the same as in the first and second embodiments, explanation of them will be omitted. In write orders 5 and 6 in FIG. 19, after the data in the second page is written, the data in the first page is written into memory cells 5, 6 adjacent to memory cells 3, 4 in the bit line direction. Thereafter, the data in the second page is written into memory cells 3, 4 (write orders 9, 10 in FIG. 19). FIG. 17C shows a state after the data in the second page is written before the data in the third page is written (after write order 10 in FIG. 19). The following is an explanation of a method of storing an additional one bit of data in a state where 4-valued or 2 bits of data have been stored.

Figure 20:
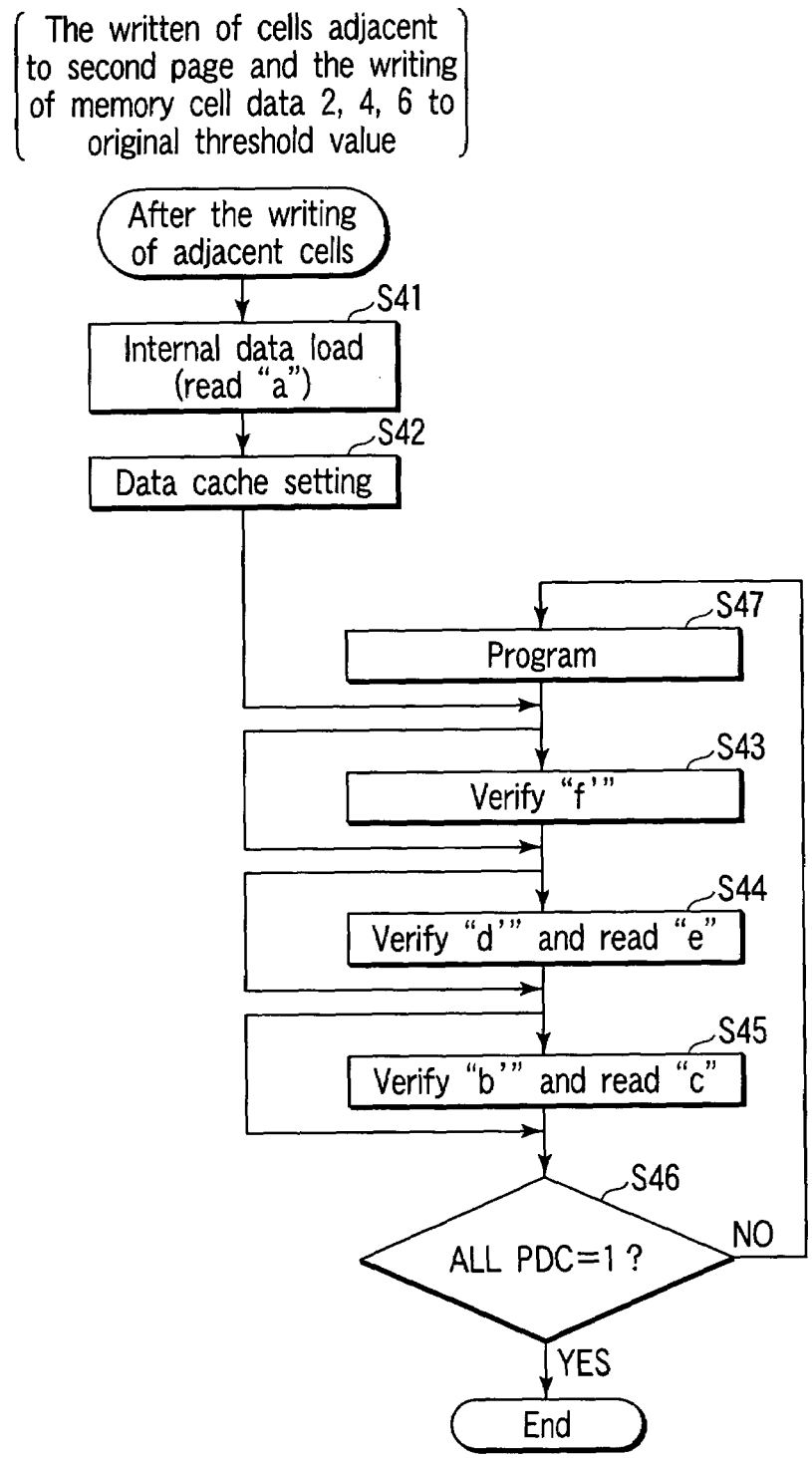
FIG. 20, which is related to the third embodiment, is a flowchart showing a case where data is written into cells adjacent to the second page after the date in the second page is written.

FIG. 20 shows a case where data is written into cells adjacent to the second page after the data in the second page is written. As in write order 11 of FIG. 19, the data in the second page has been written into memory cell 4 as in write order 10 of FIG. 19 immediately before the data in the third page is written into memory cell 1. After the writing is completed, the threshold voltage distribution of memory cell 1 is as shown in FIG. 18A.

In a cell into which data "2", "4", "6" are written, writing is done to the original verify levels of the third page, "b", "d", "f". To do this, first, the potential of the word line is set to "a," thereby reading the data written in the memory cell (FIG. 20 (S41)). FIG. 22A shows the data read in the read operation. When the data in the memory cell takes the value other than "0," data "1" is latched in the PDC. Thereafter, the data cache is operated, thereby setting the PDC as shown in FIG. 22B (S42). As a result, when the data written into the memory cell is "2", "4", "6", data "0" is latched in the PDC.

As shown in FIG. 18A, there may be a case where writing has been done to verify potentials "b*'", "d*'", "f*'" lower than the original verify potential in the second page write operation. Thereafter, the threshold voltage may have risen due to the adjacent cells written into. In addition, there are cells which have reached the original verify potentials "b'", "d'", "f'". Therefore, first, a verify operation is carried out with the original verify potentials "b'", "d'", "f'" (S43, S44, S45).

(Verifying a Cell with the Highest Threshold Voltage)

First, a cell with the highest threshold voltage, that is, a cell into which data "6" has been written is verified. In this case, a potential of "f'" a little higher than the potential "f" in a read operation is applied to the selected word line. The read potential Vread is supplied to the unselected word lines in the selected block and the select line SG1 and a specific voltage is supplied to the signal BLCLAMP and signal BLPRE of the data storage circuit 10, thereby precharging the bit line. When the threshold voltage of the memory cell is higher than "f'", the cell turns off. Therefore, the bit line remains high. When the threshold voltage of the memory cell is lower than "f'", the cell turns on. Therefore, the bit line goes to Vss. While the bit line is being discharged, the TDC is set to Vss temporarily. Thereafter, the signal REG is made high, thereby turning on the transistor 61q, which transfers the data in the DDC to the TDC.

Next, the signal DTG is made high temporarily, thereby turning on the transistor 61s, which transfers the data in the PDC to the DDC. Thereafter, the signal BLC1 is made high, thereby turning on the transistor 61h, which transfers the data in the TDC to the PDC.

Next, the signal VPRE of the data storage circuit 10 is set to Vdd and the signal BLPRE is made high, thereby precharging the TDC to Vdd. Thereafter, the signal BLCLAMP is made high. When the bit line is at the low level, the TDC goes low. When the bit line is at the high level, the TDC goes high.

When writing is done, the low level is latched in the DDC. When writing is not done, the high level is latched in the DDC. Therefore, when the signal VREG is set to Vdd and the signal REG is made high, if writing is not done, the transistor 61r turns on, with the result that the TDC is forced to go to the high level. Then, the data in the PDC is transferred to the DDC and the potential of TDC is transferred to the PDC. It is only when writing is not done or when data "6" has been written into the memory cell and the threshold voltage of the cell has reached the verify potential "f'" that the high level is latched in the PDC. In addition, it is only when the threshold voltage of the cell has not reached "f'" or when data "4" or "2" has been written into the memory cell that the low level is latched in the PDC.

(Verifying a Cell with an Intermediate Threshold Voltage) (FIG. 20 (S44, S45))

As in verifying a cell with the highest threshold voltage, it is difficult to verify a cell with an intermediate threshold voltage, that is, a cell into which data "2", "4" have been written. The reason is that, since the threshold voltage of a cell into which a threshold voltage higher than a cell with an intermediate threshold voltage has been written is higher than the intermediate threshold voltage, the result of verifying the cell with the higher threshold voltage is also acceptable. To solve this problem, a read operation is carried out to determine whether there is any cell with a threshold voltage higher than the verify potential of the intermediate threshold voltage. If there is such a cell, the result of the verify operation must be determined to be unacceptable.

To do this, a potential of "d'" or "b'" a little higher than the potential "d" or "b" in a read operation is supplied to the selected word line. The read potential Vread is supplied to the unselected word lines in the selected block and the select line SG1 and the specific voltage is supplied to the signal BLCLAMP and signal BLPRE of the data storage circuit 10, thereby precharging the bit line. When the threshold voltage of the memory cell is higher than "d'" or "b'", the cell turns off. Therefore, the bit line remains high. In addition, when the threshold voltage of the memory cell is lower than "d'" or "b'", the cell turns on. Therefore, the bit line goes to Vss.

Next, the signal VPRE of the data storage circuit 10 is set to Vdd and the signal BLPRE is made high, thereby precharging the TDC to Vdd. Thereafter, a specific high level is supplied to the signal BLCLMP. When the bit line is at the low level, the TDC goes low. When the bit line is at the high level, the TDC goes high. Then, the data in the PDC is transferred to the DDC and the potential of the TDC is transferred to the PDC. It is when the threshold voltage of the cell is higher than "d'" or "b'", that is, when the result of the verify operation is acceptable, or when data "6" has been written into the memory cell, or when data "4" or "6" has been written into the memory cell that the PDC goes to the high level.

Next, the potential of the word line is raised to a potential of "e" or "c" a little higher than "d'" or "b'". The bit line goes to the high level, when the threshold voltage of the cell is equal to or higher than "d'" or "b'". However, when the threshold voltage is lower than "e" or "c", the cell turns on, with the result that the bit line goes to Vss. Therefore, since the cell turns on only when the threshold voltage is higher than "e" or "c", the bit line remains high.

(Exchange of Data Between PDC and DDC)

While the bit line is being discharged, the TDC is set to Vss temporarily, the signal VREG is set to Vdd, and the signal REG is made high, thereby transferring the data in the DDC to the TDC. Then, the signal DTG is made high temporarily, thereby transferring the data in the PDC to the DDC. Thereafter, the data in the TDC is transferred to the PDC.

(Exchange of Data Between PDC and DDC: the Data in the DDC is Inverted and Transferred to the PDC)

The TDC is set to Vdd temporarily, the signal VREG is set to Vss, and the signal REG is made high, thereby inverting the data in the DDC and transferring the inverted data to the TDC. Thereafter, the signal DTG is made high temporarily, thereby transferring the data in the PDC to the DDC. Thereafter, the data in the TDC is transferred to the PDC.

(Exchange of Data Between PDC and DDC)

The TDC is set to Vss temporarily, the signal VREG is set to Vdd, and the signal REG is made high, thereby transferring the data in the DDC to the TDC. Then, the signal DTG is made high temporarily, thereby transferring the data in the PDC to the DDC. Thereafter, the data in the TDC is transferred to the PDC.

As a result of the operation, it is when the threshold voltage of the cell is lower than the potential "d'" or "b'" of the word line at the time of the discharging of the bit line that the DDC goes high. In addition, it is when the threshold voltage of the cell is higher than the potential "d'" or "b'" of the word line at the time of the discharging of the bit line that the DDC goes low. The data latched in the PDC is the data latched previously. That is, in the case of cells to be written into, data "0" is latched in them. In the case of cells not to be written into, data "1" is latched in them.

Next, the signal VPRE of the data storage circuit 10 is set to Vdd and the signal BLPRE is raised to a specific high level, thereby precharging the TDC to Vdd. Thereafter, a specific high level is supplied to the signal BLCLAMP. When the bit line is at the low level, the TDC goes low. When the bit line is at the high level, the TDC goes high. Here, when the signal VREG is set to Vdd and the signal REG is made high, if the high level is stored in the DDC, the TDC is forced to go to the high level. As a result, it is when the threshold voltage of the cell is lower than "d'" or "b'" or when the threshold voltage of the cell is higher than "e" or "c" that the TDC goes high. It is when the threshold voltage of the cell is higher than "d'" or "b'" or when the threshold voltage of the cell is lower than "e" or "c" that the TDC goes low. That is, it is when data "4" or "2" has been written into the memory cell and the result of the verify operation is acceptable that the TDC goes low. Thereafter, the data in the PDC is transferred to the DDC and the potential of the TDC is transferred to the PDC.

(Exchange of Data Between PDC and DDC)

The TDC is set to Vss temporarily, the signal VREG is set to Vdd, and the signal REG is made high, thereby transferring the data in the DDC to the TDC. Thereafter, the signal DTG is made high temporarily, thereby transferring the data in the PDC to the DDC. Then, the data in the TDC is transferred to the PDC.

(Exchange of Data Between PDC and DDC: the Data in the DDC is Inverted and Transferred to the PDC)

The TDC is set to Vdd temporarily, the signal VREG is set to Vss, and the signal REG is made high, thereby inverting the data in the DDC and transferring the inverted data to the TDC. Thereafter, the signal DTG is made high temporarily, thereby transferring the data in the PDC to the DDC. Then, the data in the TDC is transferred to the PDC.

The TDC is set to Vss temporarily, the signal VREG is set to Vdd, and the signal REG is made high, thereby transferring the data in the DDC to the TDC. Thereafter, the signal DTG is made high temporarily, thereby transferring the data in the PDC to the DDC. The signal VREG is set to Vdd and the signal REG is made high. Then, when the high level is latched in the DDC, the TDC is forced to go to the high level. As a result, it is when data "4" or "2" has been written into the memory cell and the result of the verification is acceptable or when data "1" (writing unselected) has been latched that the TDC goes to the high level. Thereafter, the data in the TDC is transferred to the PDC.

(Program Operation) (S47)

A program operation is the same as the program operation in the first and second embodiments. When data "1" has been stored in the PDC, writing is not done. When data "0" has been stored, writing is done.

(Program Verify) (S43 to S46, S47)

After the program, a verify operation is carried out with the original verify potentials "b'", "d'", "f'". The program and verify operation is repeated until the data in all of the PDCs become "1". The program and verify operation is the same as the verifying of the cell with the highest threshold voltage and the cell with the intermediate threshold voltage.

As a result of the program and verify operation, the threshold voltage distribution of data "0", "2", "4", "6" in the memory cell is as shown in FIG. 18B.

(Third Page Write)

Next, the third-pate write operation will be explained by reference to FIG. 21.

(Data Load, Read Operation, and Data Cache Setting)

Next, the writing data for the third page is externally loaded into the PDC (S51). FIG. 23A shows the data loaded into the PDC. After a write command is inputted, the potentials "a", "d", "f" in a read operation are supplied to the word line, thereby reading the data in the memory cell (S52 to S54). According to the data read out, the data cache is set (S55). As a result, the data latched in the PDC is as shown in FIG. 23B. In FIG. 23B, data "1" means that writing is not selected and data "0" means that writing is selected.

(Program Operation) (S56)

A program operation is the same as the program operation in the first and second embodiments. When data "1" has been stored in the PDC, writing is not done. When data "0" has been stored, writing is done.

(Program Verify) (S57 to S60)

After the program, a verify operation is carried out with the original verify potentials "a'", "c'", "e'", "g'". The verify operation is repeated until the data in all of the PDCs become "1" (S61 to S56). In the program verify operation, the verify operation with the verify potential "g'" is the same as the verifying of the cell with the highest threshold voltage. The verify operation with the verify potentials "a'", "c'", "e'" is the same as the verify operation with the intermediate threshold voltage. After those verify operations, the potential of the word line is set to the read voltages "b", "d", "f" and the data in the memory cell is read, thereby preventing the cells with a threshold voltage higher than the data just read from being accepted as the result of the verify operation.

With the third embodiment, a NAND flash memory storing 8-valued or three bits of data can be configured using a data storage circuit composed of three data caches. Therefore, a much larger volume of data can be stored with a smaller circuit configuration.

In the third embodiment, to simplify the operation, an additional one bit of data is stored in the state where 4-valued or two bits of data have been stored as shown in FIG. 17C, which enables 8-valued or three bits of data to be stored. In addition, the operation of the third embodiment may be applied to a case where an additional one bit of data is stored in the state where binary or one bit of data has been stored as shown in FIG. 17A, which enables 4-valued or two bits of data to be stored.

Furthermore, not only 8-valued or three bits of data but also 16-valued or more data can be written almost in the same operation as the third embodiment.

Fourth Embodiment

A fourth embodiment of the present invention is modified from the third embodiment. In the third embodiment, before the third page (the data in the third bit) is written into, the data in the memory cells in the second page and the first page (4-valued or two bits of data) has been written to the original verify potentials "b'", "d'", "f'". However, this operation may be omitted, when there is room for the threshold voltage distribution. In this case, the operation shown in FIG. 20 is omitted and only the writing of data "1", "3", "5", "7" in the third page shown in FIG. 21 is done.

With the fourth embodiment, it is not necessary to write the data in the memory cells in the second page and the first page to the original verify potentials "b'", "d'", "f'", which enables the program operation to be carried out at higher speed.

Fifth Embodiment

In the first to fourth embodiments, the data storage circuit 10 is shared by two bit lines as shown in FIGS. 1 and 3. The present invention is not limited to this.

Figure 24:
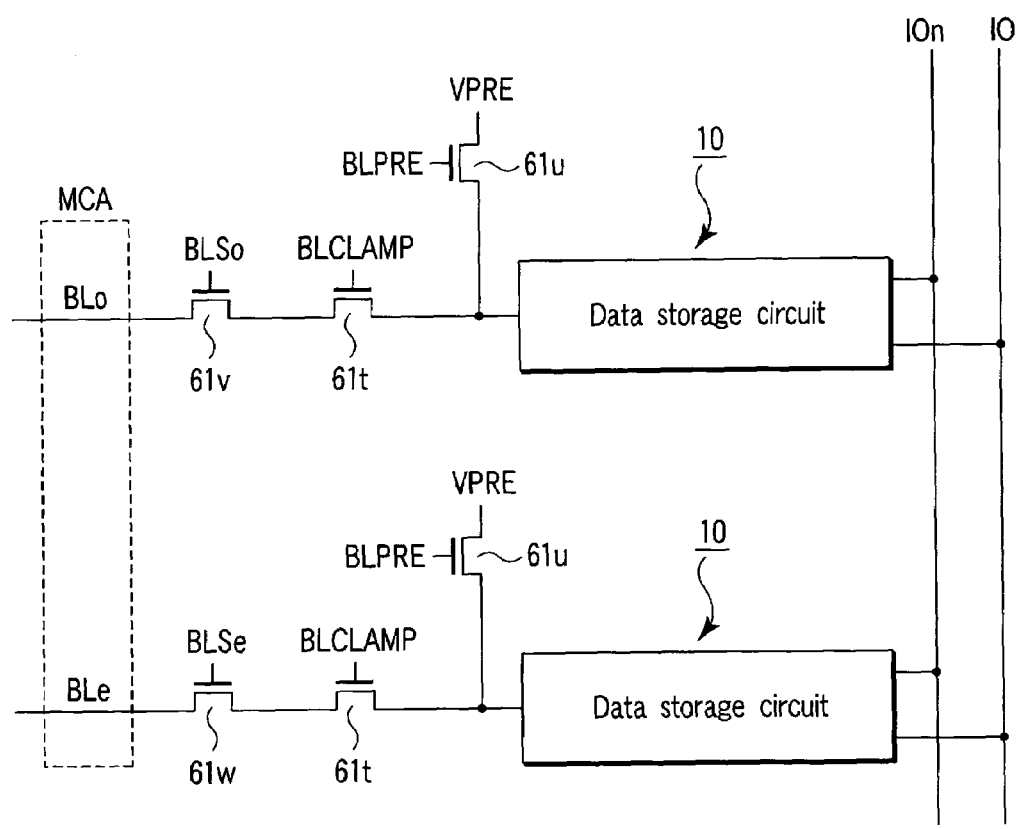
FIG. 24 is a circuit diagram of a data storage circuit according to a fifth embodiment of the present invention.

FIG. 24 shows a fifth embodiment of the present invention. In the fifth embodiment, data storage circuits 10 are connected to the individual bit lines. With this configuration, the number of transistors acting as high-breakdown-voltage transistors can be halved. In the case of the configuration of FIG. 1, high-breakdown-voltage transistors 61x, 61v are connected to both ends of the bit line BLo and high-breakdown-voltage transistors 61y, 61w are connected to both ends of the bit line BLe. The transistors 61x, 61y are transistors for supplying the potential of the signal BLCRL. The sizes of the transistors 61x, 61y, 61v, 61w are much larger than those of the transistors constituting the PDC and others. However, as shown in FIG. 24, when the data storage circuits 10 are connected to the individual bit lines, the transistors 61x, 61y can be omitted. Therefore, even when the data storage circuits are connected to the individual lines, the chip size can be prevented from increasing.

What is claimed is:

1. A nonvolatile semiconductor memory device comprising:

a memory cell which stores a plurality of data items in n-valued (n is a natural number equal to one or more) threshold voltages;

a first data storage circuit which is connected to the memory cell and which stores externally inputted data of a first logic level or a second logic level;

a second data storage circuit which is connected to the memory cell and which stores the data of the first logic level or second logic level read from the memory cell; and a control circuit which controls the memory cell and the first and second data storage circuits and which sets the logic level of the data stored in the second data storage circuit to the first logic level when the logic level of the externally inputted data is the second logic level, carries out a write operation of raising the threshold voltage of the memory cell when the logic level of the data stored in the first data storage circuit is the first logic level, sets the logic level of the data stored in the first data storage circuit to the second logic level when the memory cell has reached the first threshold voltage, holds the threshold voltage of the memory cell without changing the threshold voltage when the logic level of the data stored in the first data storage circuit is the second logic level, and continues writing until the logic level of the first data storage circuit has reached the second logic level, sets the logic level of the data stored in the first data storage circuit to the first logic level when the logic level of the data stored in the second data storage circuit is the second logic level, and carries out a write operation of raising the threshold voltage of the memory cell when the logic level of the data stored in the first data storage circuit is the first logic level, sets the data stored in the first data storage circuit to the second logic level when the memory cell has reached the second threshold voltage, and holds the threshold voltage of the memory cell without changing the threshold voltage when the logic level of the data stored in the first data storage circuit is the second logic level.

2. The nonvolatile semiconductor memory device according to claim 1, wherein the first threshold voltage is lower than the second threshold voltage.

3. The nonvolatile semiconductor memory device according to claim 1, wherein the memory cell constitutes a NAND memory cell.

4. The nonvolatile semiconductor memory device according to claim 1, wherein the first data storage circuit is a latch circuit with a first, a second, and a third terminal, the first and second terminals being selectively connected to data lines and the third terminal being selectively connected to a bit line.

5. The nonvolatile semiconductor memory device according to claim 1, wherein the second data storage circuit is composed of a MOS capacitor.

6. The nonvolatile semiconductor memory device according to claim 4, further comprising:

a third data storage circuit which is provided between the first data storage circuit and the second data storage circuit and which stores the data in the first data storage circuit.

7. The nonvolatile semiconductor memory device according to claim 6, wherein the third data storage circuit comprising:
- a first transistor one end of whose current path is connected to the third terminal of the first data storage circuit and to whose gate a first control signal is supplied; and
- a second transistor to one end of whose current path a second control signal is supplied and whose gate is connected to the other end of the current path of the first transistor.

8. The nonvolatile semiconductor memory device according to claim 7, further comprising:
- a third transistor which is connected between the other end of the current path of the second transistor and the second data storage circuit and which transfers the data from the third data storage circuit to the second data storage circuit; and
- a fourth transistor which is connected between the third terminal of the first data storage circuit and the second data storage circuit and which transfers the data from the second data storage circuit to the first data storage circuit.

* * * * *